(12) United States Patent
Chiu et al.

(10) Patent No.: US 12,426,231 B2
(45) Date of Patent: Sep. 23, 2025

(54) STRUCTURES OF SRAM CELL AND METHODS OF FABRICATING THE SAME

(71) Applicant: Taiwan Semiconductor Manufacturing Company, Ltd., Hsinchu (TW)

(72) Inventors: Kuan-Chung Chiu, Hsinchu (TW); Wei-Hua Chen, Hsinchu (TW); Chieh Lee, Hsinchu (TW); Chun-Ying Lee, Hsinchu (TW); Yi-Ching Liu, Hsinchu (TW); Chia-En Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 169 days.

(21) Appl. No.: 18/366,471

(22) Filed: Aug. 7, 2023

(65) Prior Publication Data
US 2025/0056785 A1 Feb. 13, 2025

(51) Int. Cl.
*G11C 5/06* (2006.01)
*G11C 11/412* (2006.01)
(Continued)

(52) U.S. Cl.
CPC ............ *H10B 10/18* (2023.02); *G11C 5/063* (2013.01); *G11C 11/412* (2013.01); *G11C 11/419* (2013.01); *H10B 10/12* (2023.02)

(58) Field of Classification Search
CPC ........ H10B 10/18; H10B 10/12; G11C 5/063; G11C 11/412; G11C 11/419
See application file for complete search history.

(56) References Cited

U.S. PATENT DOCUMENTS

2022/0199629 A1\* 6/2022 Chhabra ............ H10D 84/0186
2022/0223610 A1\* 7/2022 Chhabra ............ H10D 30/6757
(Continued)

FOREIGN PATENT DOCUMENTS

TW 201732878 A 9/2017

OTHER PUBLICATIONS

Office Action issued in connection with Taiwan Appl. No. 112144603 dated Jul. 19, 2024.

*Primary Examiner* — Min Huang
(74) *Attorney, Agent, or Firm* — FOLEY & LARDNER LLP

(57) ABSTRACT

An SRAM cell includes a first n-type channel (n-channel) layer engaged with a first gate layer to form a first device; a first p-type channel (p-channel) layer engaged with the first gate layer to form a second device, the first gate layer stacked between the first n-channel layer and the first p-channel layer along a first direction; a second n-channel layer engaged with a second gate layer to form a third device, the second gate layer coupled to a first word line and the second n-channel layer coupled to the first n-channel layer along a second direction perpendicular to the first direction; a third n-channel layer engaged with a third gate layer to form a fourth device, the third n-channel layer spaced from the second n-channel layer along a third direction perpendicular to the first direction and the second direction; a second p-channel layer engaged with the third gate layer to form a fifth device, the third gate layer stacked between the third n-channel layer and the second p-channel layer along the first direction; and a fourth n-channel layer engaged with a fourth gate layer to form a sixth device, the fourth gate layer coupled to a second word line and the fourth n-channel layer coupled to the third n-channel layer along the second direction.

20 Claims, 21 Drawing Sheets

(51) Int. Cl.
*G11C 11/419* (2006.01)
*H10B 10/00* (2023.01)

(56) References Cited

U.S. PATENT DOCUMENTS

2023/0282253 A1* 9/2023 Chhabra .............. G11C 7/1075
                                                                         365/189.011
2023/0335537 A1* 10/2023 Saini .................... H01L 25/074

* cited by examiner

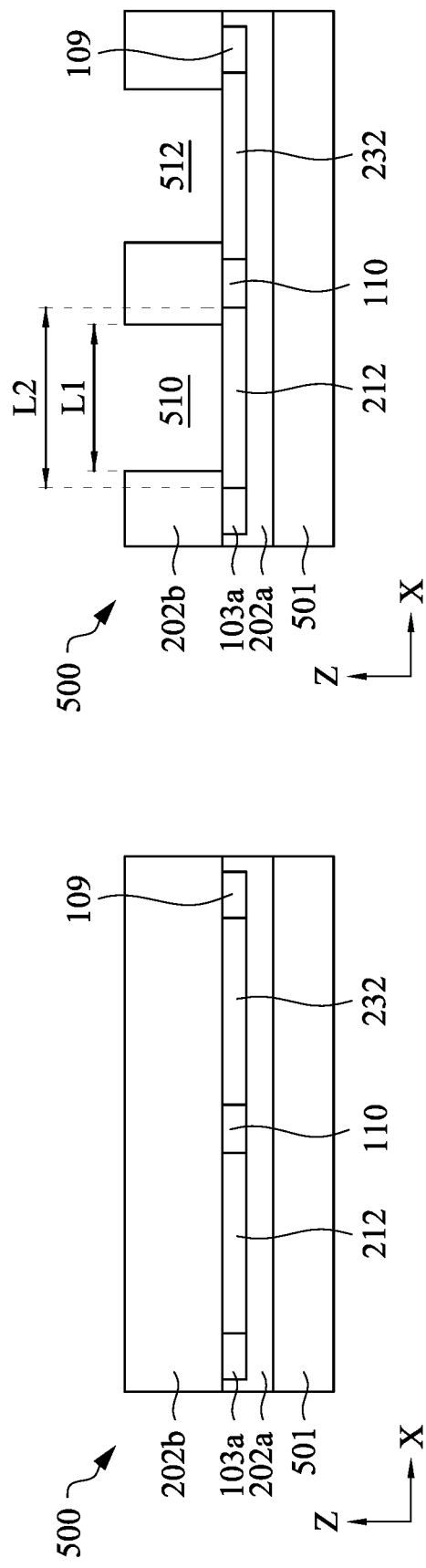

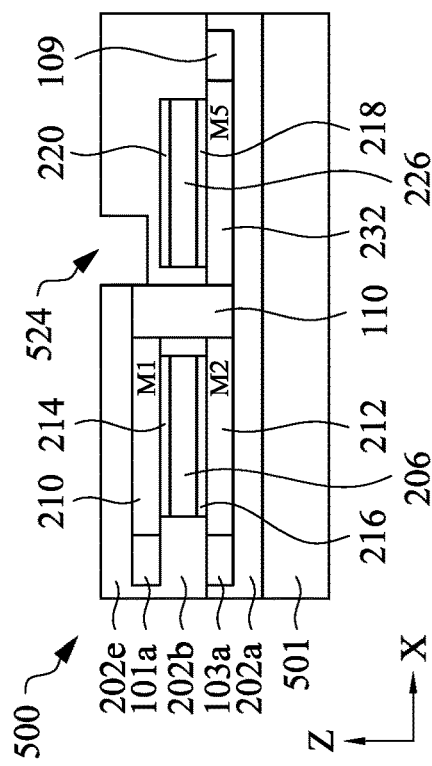
FIG. 37
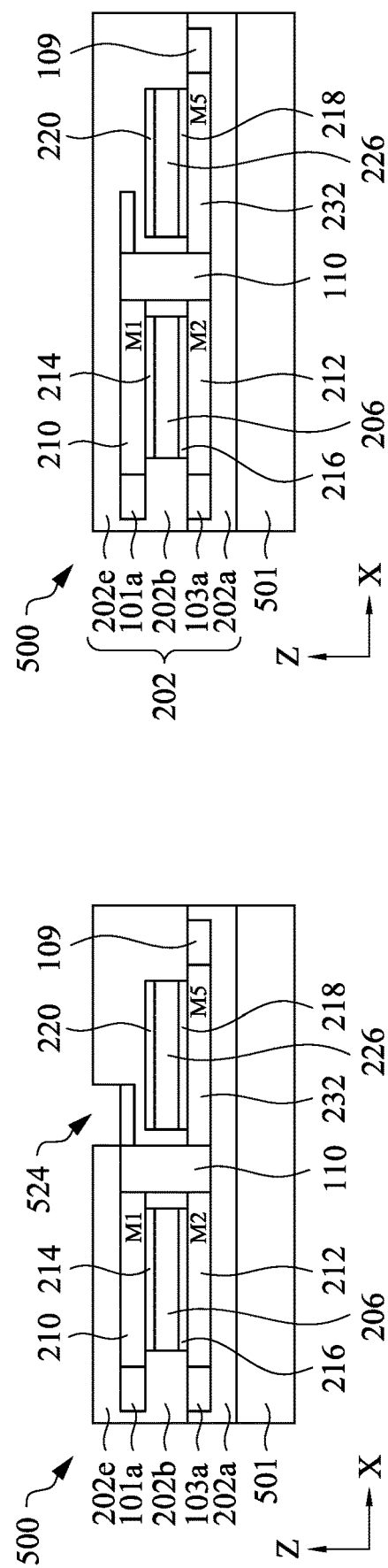
FIG. 39
FIG. 38

STRUCTURES OF SRAM CELL AND METHODS OF FABRICATING THE SAME

BACKGROUND

The semiconductor integrated circuit (IC) industry has produced a wide variety of digital devices to address issues in a number of different areas. Some of these digital devices are configured for the storage of data. Static random-access memory (SRAM) device is a type of volatile semiconductor memory that stores data bits using circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters. While existing implementations of SRAM cells as a part of front-end-of-line (FEOL) processing have been generally adequate, they are not entirely satisfactory in all aspects. For example, device density of FEOL SRAM devices is generally limited by an IC chip's planar surface area, and an increase in device density demands an increased chip area and, consequently, higher cost associated with device fabrication. Accordingly, improvements in the structure of memory devices, such as SRAM devices, toward lower area consumption are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21, 22, 23, 24, 25, 26, 27, 28, 29, 30, 31, 32, 33, 34, 35, 36, 37, 38, and 39 each illustrate a cross-sectional view of the memory cell at intermedia stages of the method of FIG. 20, in accordance with some embodiments.

DETAILED DESCRIPTION

Figure 1:
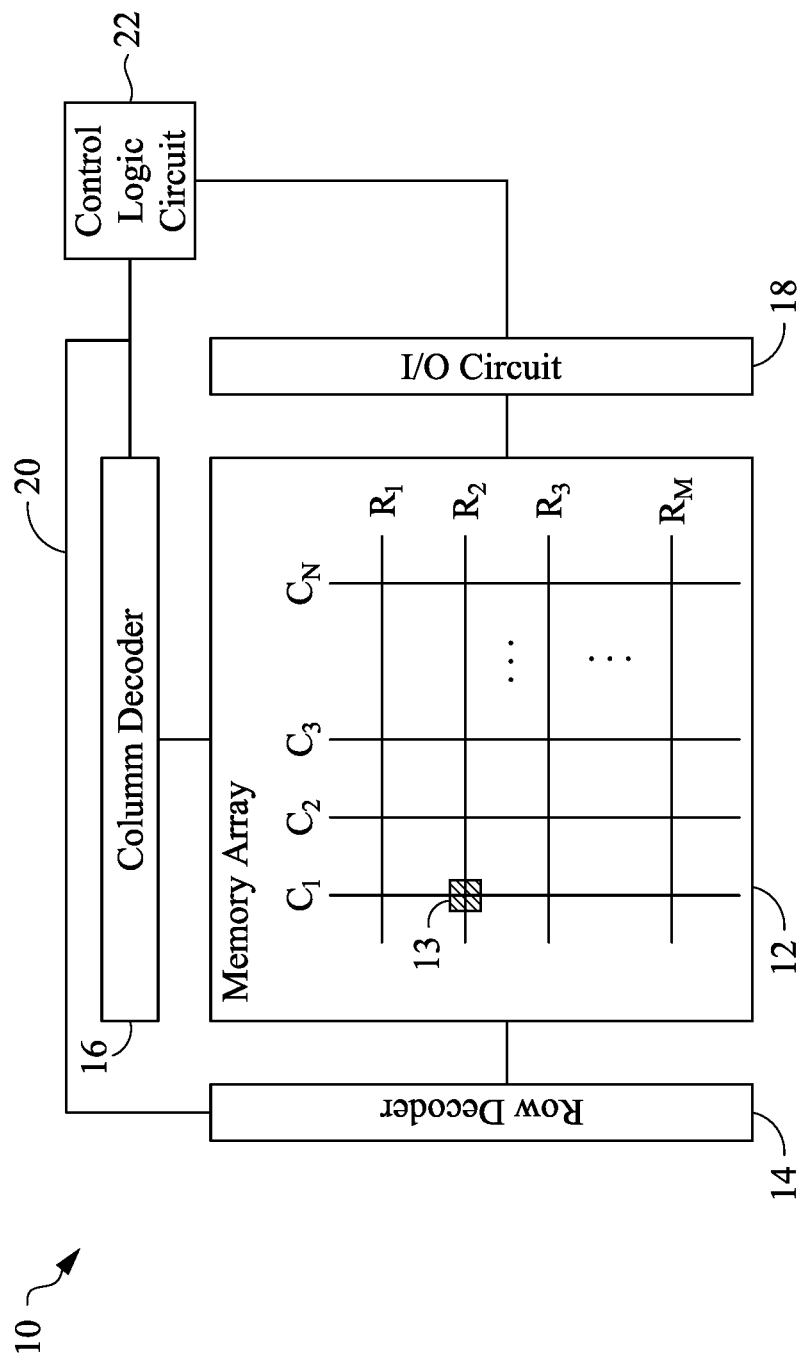
FIG. 1 illustrates a block diagram of a semiconductor device including a plurality of memory cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example block diagram of a semiconductor (e.g., memory) device 10, in accordance with various embodiments. In the illustrated embodiment of FIG. 1, the memory device 100 includes a memory array 12, a row decoder 14, a column decoder 16, an input/output (I/O) circuit 18, and a control logic circuit 22. Despite not being explicitly shown in FIG. 1, the components of the semiconductor device 10 may be operatively coupled to each other and to the control logic circuit 22. For example, the control logic circuit 22, the I/O circuit 18, the column decoder 16, and the row decoder 14 may be electrically coupled to the memory array 12. Although, in the illustrated example of FIG. 1, the components are shown as separate blocks for the purpose of clear illustration, in some other embodiments, some or all of the components may be integrated together. For example, the memory array 12 may include an embedded I/O circuit 18. In some embodiments, the row decoder 14, the column decoder 16, the I/O circuit 18, and the control logic circuit 22 may be collectively referred to as the peripheral circuit (PC) 20. The PC 20 may further include other components not depicted herein, such as drivers (e.g., word line drivers).

The memory array 12 is a hardware component that stores data. In one aspect, the memory array 12 is embodied as a semiconductor memory device. The memory array 12 includes a plurality of memory cells (or otherwise storage units) 13. The memory array 12 includes a plurality of rows $R_1, R_2, R_3 \ldots R_M$, each extending in a first direction (e.g., X-direction) and a plurality of columns $C_1, C_2, C_3 \ldots C_N$, each extending in a second direction (e.g., Y-direction). Each of the rows/columns may include one or more conductive structures. In some embodiments, each memory cell 13 is arranged in the intersection of a corresponding row and a corresponding column and can be operated according to voltages or currents through the respective conductive structures of the column and row. In the present embodiments, each memory cell 13 corresponds to a static random-access memory (SRAM) cell.

The row decoder 14 is a hardware component that can receive a row address of the memory array 12 and assert a conductive structure (e.g., a word line) at that row address. The column decoder 16 is a hardware component that can receive a column address of the memory array 12 and assert one or more conductive structures (e.g., a bit line, a source line) at that column address. The I/O circuit 18 is a hardware component that can access (e.g., read, program) each of the memory cells 13 asserted through the row decoder 14 and column decoder 16. The control logic circuit 22 is a hardware component that can control the coupled components (e.g., 12 through 18).

Figure 2:
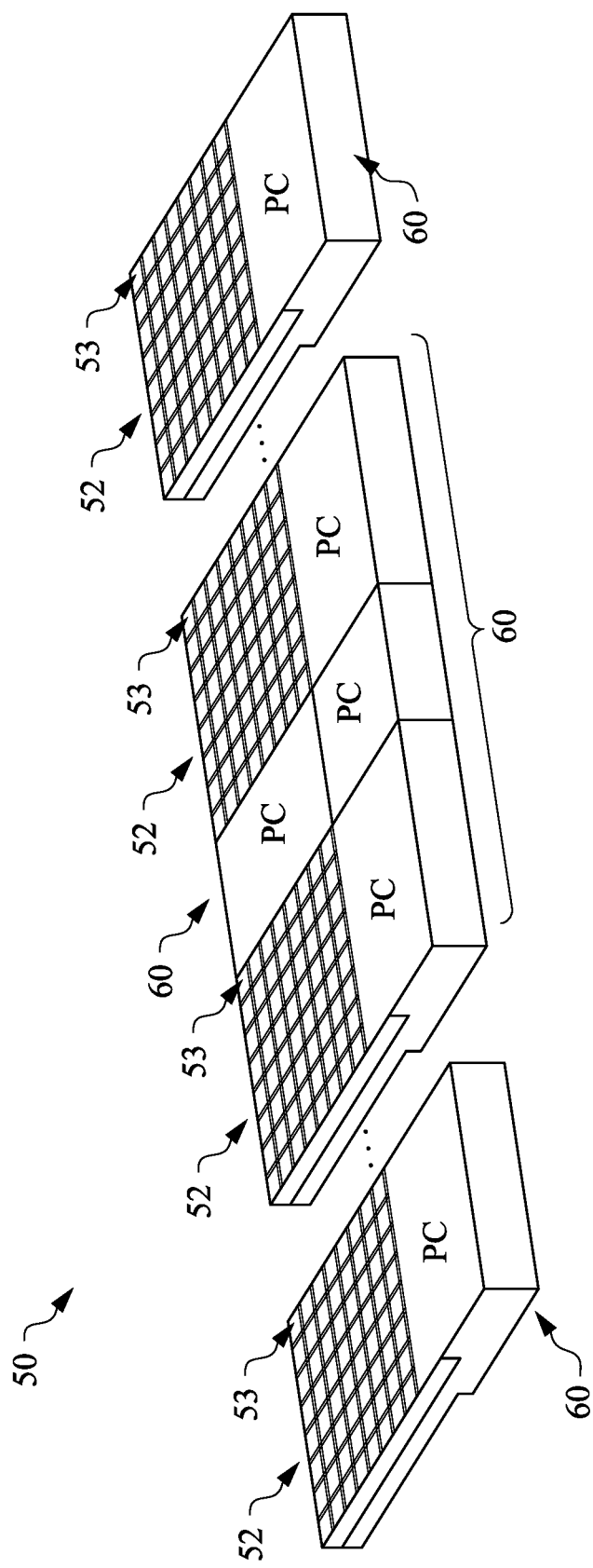
FIG. 2 illustrates a three-dimensional (3D) perspective view of an example semiconductor device including a plurality of memory cells, in accordance with some embodiments.

Referring to FIG. 2, a schematic of an example semiconductor device 50 is illustrated. The semiconductor device 50 includes a plurality of memory arrays 52, each of which is similar to the memory array 12, coupled to a plurality of PC 60, each of which may include one or more components similar to those of the PC 20. As used in the present disclosure, terms such as "couple" and "connect" refer to electrical and/or physical connection, with or without any intervening layer(s) or component(s), between two components of a semiconductor device. Each of the memory arrays 52 includes a plurality of memory cells 53 similar to the memory cells 13. For example, the memory cell 53 may be an SRAM cell. In a further example, the memory cell 53 may be an SRAM cell formed by front-end-of-line (FEOL) processing. In some embodiments, the memory arrays 52 and the PC 60 are coupled to one another in a network structure that extends over a same plane. In this regard, a density of the memory cells 53 in the semiconductor device 50 would be limited by a planar area of a chip (or wafer). An increase in the density may result in a demand for larger chip area and thus, higher cost associated with device fabrication. In this regard, as IC technology continues to advance, limitation in the density of memory cells in semiconductor memory devices may limit the development of devices with higher processing speed at reduced length scales. Accordingly, improvements in the structure of semiconductor memory devices toward lower area consumption are desired.

The present disclosure provides structures of SRAM cells formed in a back-end-of-line (BEOL) network. In the present embodiments, a BEOL network enables transistors of each SRAM cell to be formed in a stacked, rather than a planar, configuration, which reduces the demand for chip area and lowers the cost associated with device fabrication. Furthermore, the BEOL network provides additional design flexibility with respect to cell architectures and routing structures when compared to planar SRAM cells fabricated as a part of an FEOL network, which generally includes device features along a major surface of a semiconductor substrate. The BEOL network, in contrast, generally includes various interconnect structures, such as horizontal interconnect structures (e.g., metal lines) and vertical interconnect structures (e.g., vias), configured to connect the device features of the FEOL network with additional features to form an IC chip, for example. The present disclosure provides memory devices including SRAM cells formed as a part of a BEOL network rather than an FEOL network, as discussed in detail below.

Figure 3:
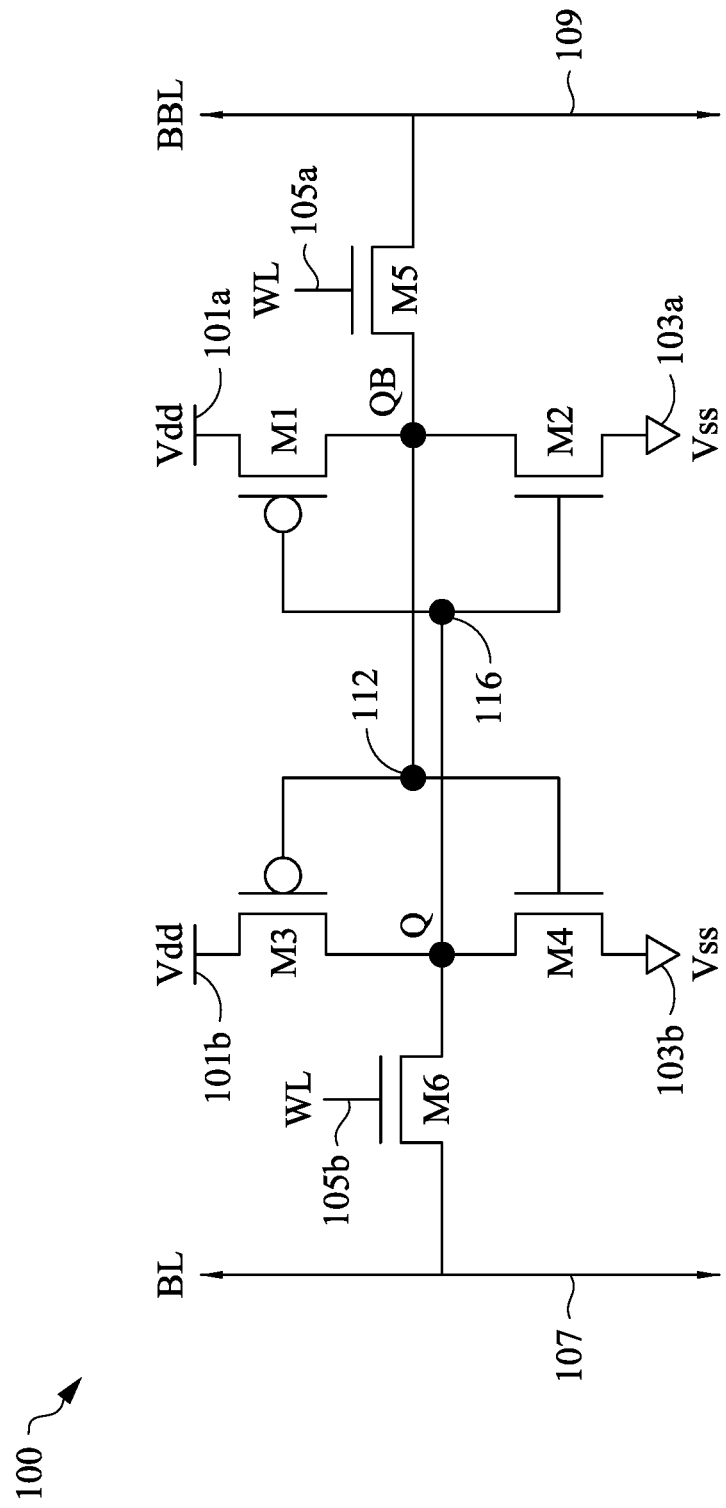
FIG. 3 illustrates an example circuit diagram, in accordance with some embodiments.

Referring to FIG. 3, an example circuit diagram of a memory cell (a memory bit, or a bit cell; similar to the memory cells 13 and 53) 100 is illustrated. In accordance with some embodiments of the present disclosure, the memory cell 100 is configured as an SRAM cell that includes a number of transistors. For example, as depicted herein, the memory cell 100 includes six-transistors (6T) and is therefore referred to as a 6T SRAM cell. In some embodiments, the memory cell 100 may be implemented as any of a variety of SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Although the discussion of the current disclosure is directed to an SRAM cell, it is understood that other embodiments of the current disclosure can also be used in any of the memory cells such as, for example, dynamic random access memory (DRAM) cells.

As shown in FIG. 3, the memory cell 100 includes 6 transistors: M1, M2, M3, M4, M5, and M6. The transistors M1 and M2 are formed as a first inverter (or first cross-coupled inverter) and the transistors M3 and M4 are formed as a second inverter (or second cross-coupled inverter), wherein the first and second inverters are cross-coupled to each other. Specifically, the first and second inverters are each coupled between first contacts 101a/101b, where a supply voltage (Vdd) is applied, and second contacts 103a/103b, which are connected to ground. In this regard, the first contacts 101a/101b are labeled with "Vdd" and the second contacts 103a/103b are labeled with "Vss". In addition to being coupled to the first and second inverters, the transistors M6 and M5 are each coupled to a word line (WL) 105a and 105b, respectively. The transistors M6 and M5 are further coupled to a bit line (BL) 107 and a bit bar line (BBL) 109, respectively. It is noted that the first contacts 101a and 101b may be coupled together, the second contacts 103a and 103b may be coupled together, and the WLs 105a and 105b may be coupled together in some embodiments.

In some embodiments, the transistors M1 and M3 are referred to as pull-up transistors of the memory cell 100; the transistors M2 and M4 are referred to as pull-down transistors of the memory cell 100; and the transistors M5 and M6 are referred to as access transistors of the memory cell 100. In some embodiments, the transistors M2, M4, M5, and M6 each include an n-type metal-oxide-semiconductor (NMOS) transistor, and M1 and M3 each include a p-type metal-oxide-semiconductor (PMOS) transistor. In some embodiments, as depicted herein, the memory cell 100 includes four NMOS transistors and two PMOS transistors. In some embodiments, the memory cell 100 includes two NMOS transistors and four PMOS transistors. Although the illustrated embodiment of FIG. 3 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 have a gate (e.g., gate layer or gate electrode) coupled to the WL 105a and WL 105b, respectively. The gates of the transistors M5 and M6 are configured to receive a pulse signal, through the WL 105a/105b, respectively, to allow or block an access of the memory cell 100 accordingly. The transistors M2 and M5 are coupled to each other at Q bar (QB) node with the transistor M2's drain and the transistor M5's source. The QB node is further coupled to the drain of the transistor M1 and node 112. The transistors M4 and M6 are coupled to each other at Q node with the transistor M4's drain and the transistor M6's source. The Q node is further coupled to a drain of the transistor M3 and node 116.

When a memory cell (e.g., the memory cell 100) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 3, when the memory cell 100 store a data bit at a logical 1 state, the QB node is configured to be at the logical 1 state, and the Q node is configured to be at the logical 0 state.

To read the logical state of the data bit stored in the memory cell 100, the BL 107 and BBL 109 are pre-charged to Vdd (e.g., a logical high, e.g., using a capacitor to hold the charge). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BBL 109 may start to be discharged. For example, when the memory cell 100 stores a logical 0, the Q node may present a voltage corresponding to the logical 1, and the QB node may present a voltage corresponding to the complementary logical 0. In response to the access transistors M5 and M6 being turned on, a discharge path, starting from the pre-charged BBL 109, through the access transistor M5 and pull-down transistor M2, and to ground 103, may be provided. While the voltage level on the BBL 109 is pulled down by such a discharge path, the pull-down transistor M4 may remain turned off. As such, the BL 107 and the BBL 109 may respectively present a voltage level to produce a large enough voltage difference between the BL 107 and BBL 109. Accordingly, a sensing amplifier, coupled to the BL 107 and BBL 109, can use a polarity of the voltage difference to determine whether the logical state of the data bit is a logical 1 or a logical 0.

To write the logical state of the data bit stored in the memory cell 100, the data to be written is applied to the BL 107 and/or the BBL 109. For example, BBL 109 is tied/shorted to 0V, e.g., Vss, with a low-impedance connection. Then, the WL 105a/105b is asserted, or activated, by an assert signal to a logical high, which turns on the access transistors M5 and M6. Once the access transistors M5 and M6 are turned on, based on the logical state of BBL 109, the QB node may start to be discharged. For example, before M5 and M6 are turned on, the BBL 109 may present a voltage corresponding to the logical 0, and the QB node may present a voltage corresponding to the complementary logical 1. In response to the access transistors M5 and M6 being turned on, a discharge path, starting from the QB node, through the access transistor M5 to ground 103, may be provided. Once the voltage level on the QB node is pulled down below the Vth (threshold voltage) of the pull-down transistor M4, M4 may turn off and M3 may turn on, causing the Q node to be pulled up to Vdd 101. Once the Q node is less than a Vth from Vdd, M1 may turn off and M2 may turn on, causing the QB node to be pulled down to ground 103. Then, when the WL 105a/105b is de-asserted, the logical state applied to the BL 107 and/or the BBL 109 has been stored in the memory cell 100.

Figure 4:
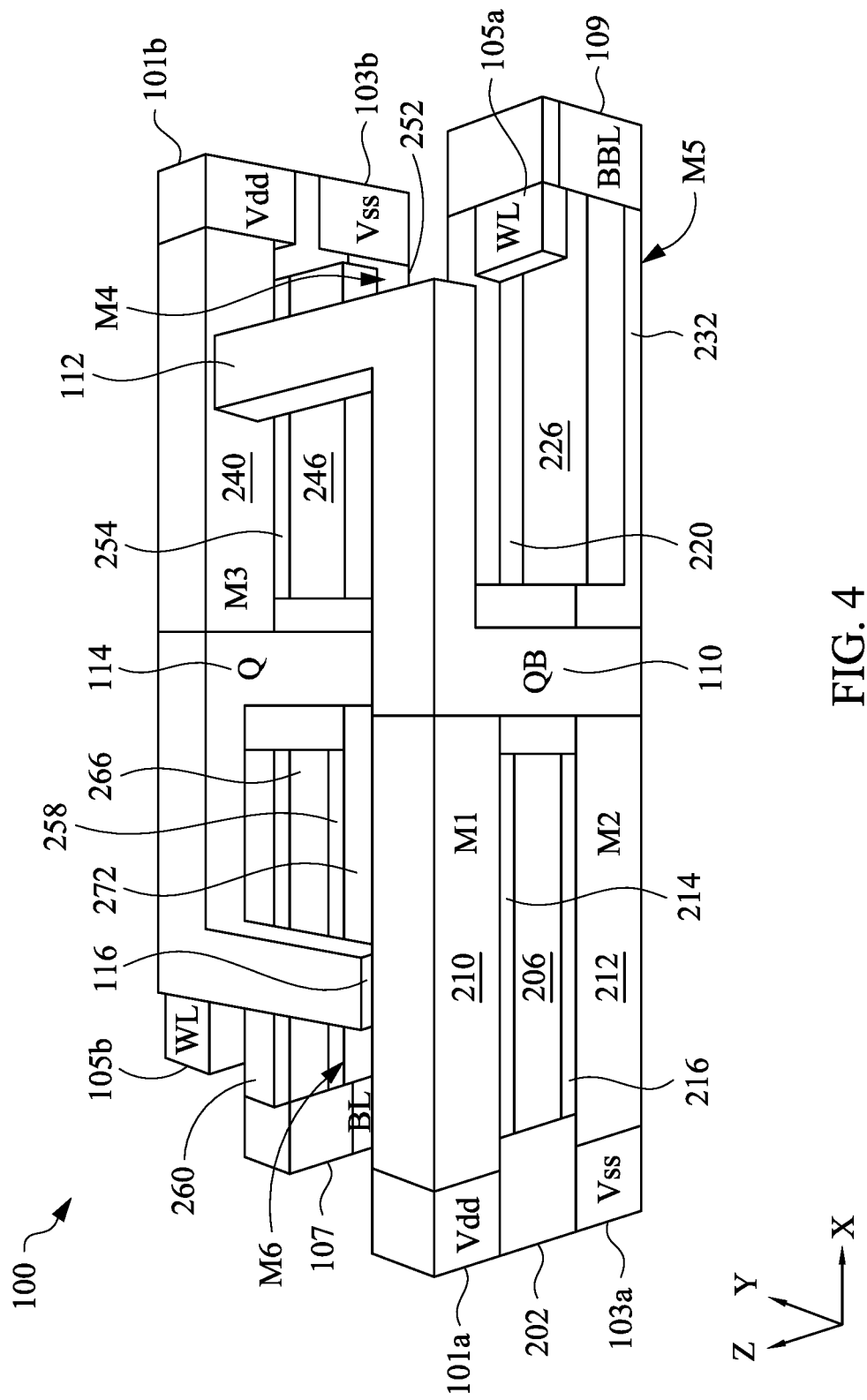
FIG. 4 illustrates a 3D perspective view of an example memory cell corresponding to the circuit diagram of FIG. 3, in accordance with some embodiments.
Figure 5:
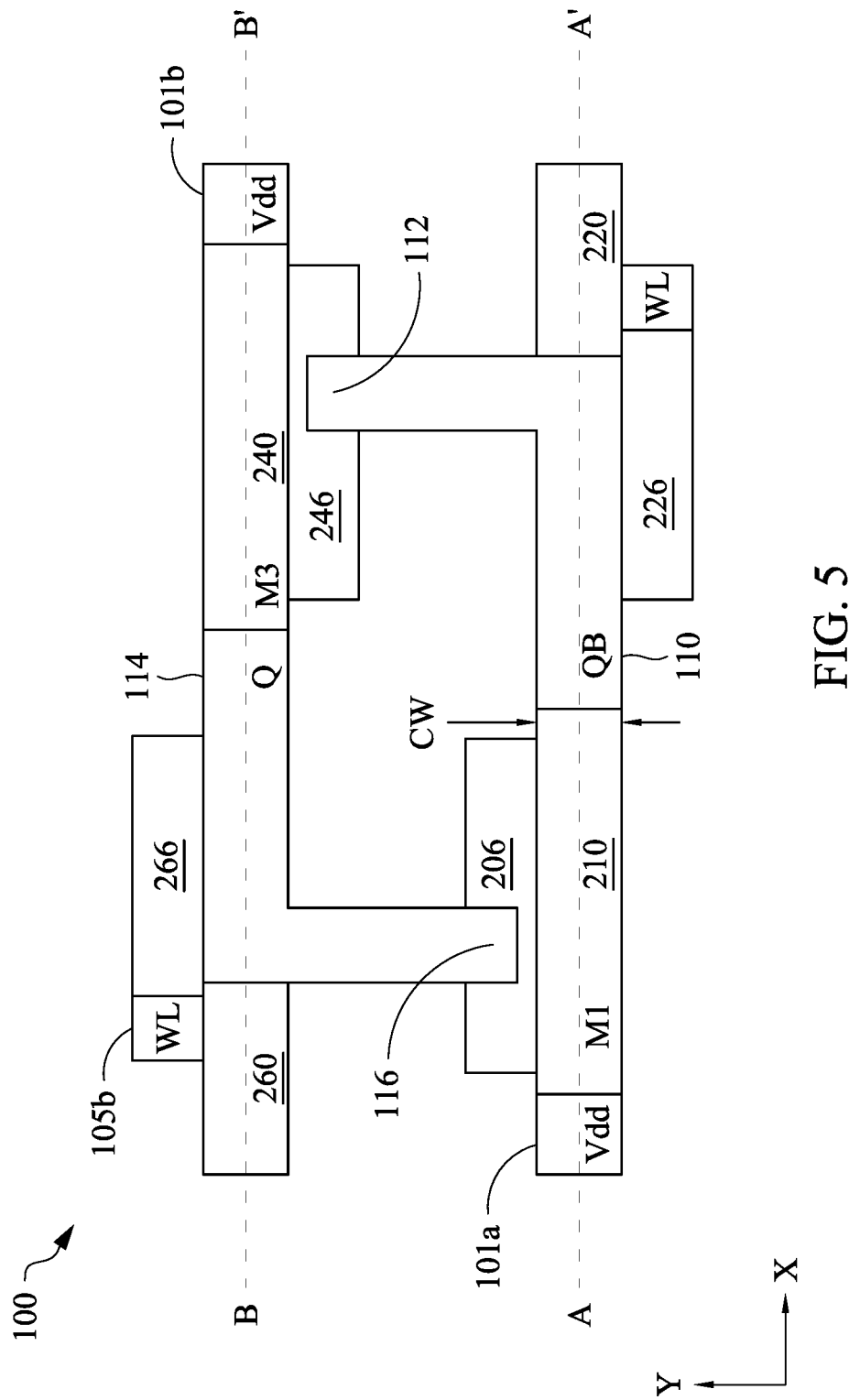
FIG. 5 illustrates a planar top view of the memory cell of FIG. 4, in accordance with some embodiments.
Figure 6:
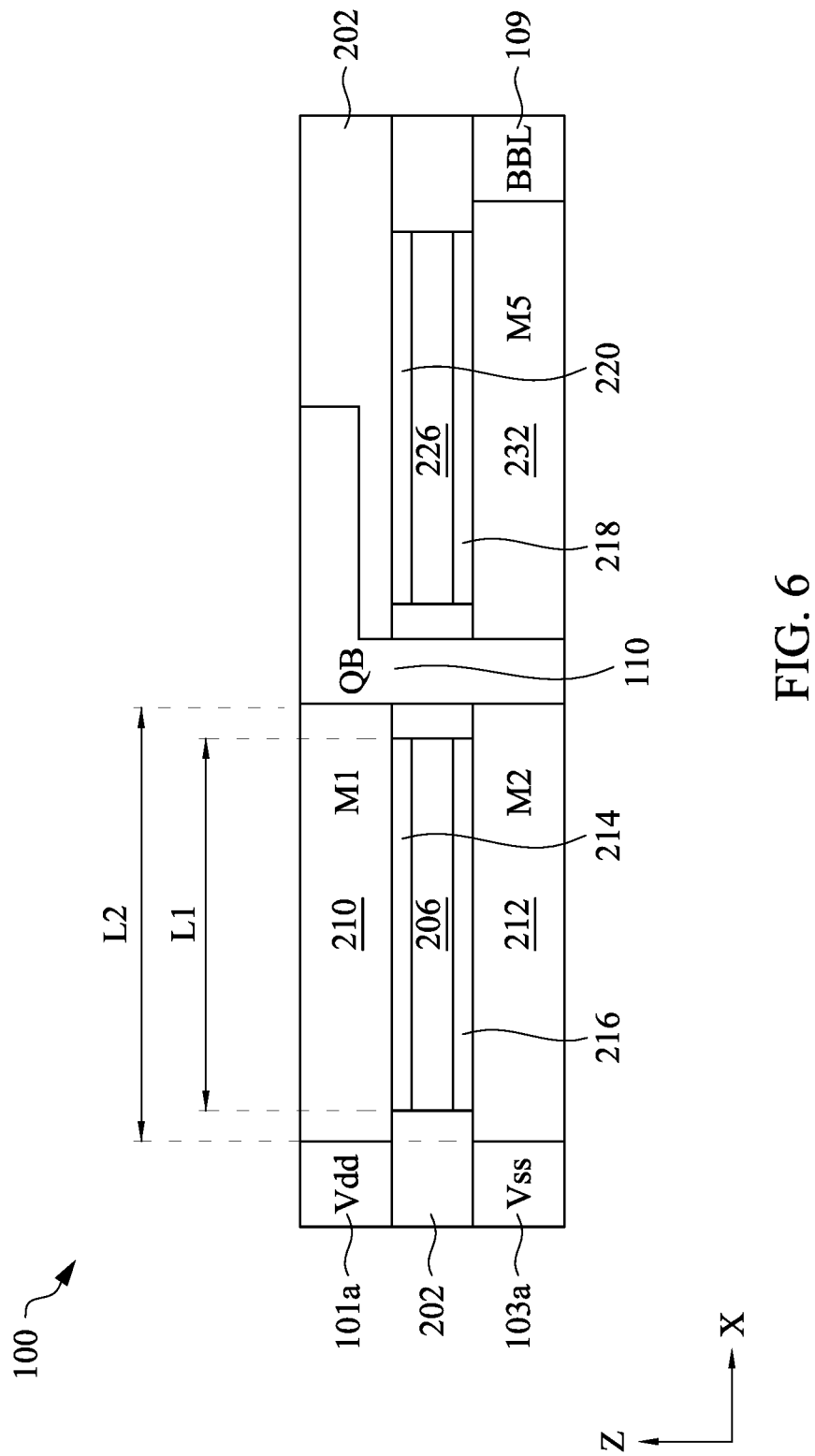
FIG. 6 illustrates a cross-sectional view of the memory cell of FIG. 5 along line A-A', in accordance with some embodiments.

Referring to FIGS. 4-6 collectively, an embodiment of the memory cell 100 showing detailed arrangement of various transistors is illustrated. FIG. 4 depicts a 3D perspective view of the memory cell 100; FIG. 5 depicts a top view of the memory cell 100 in the X-Y plane; and FIG. 6 depicts a cross-sectional view of the memory cell 100 along line A-A' of FIG. 5. It is noted that portions of the memory cell 100 may be omitted for purposes of clarity. For example, portions of a dielectric (or insulation) layer 202 that surrounds the various components of the memory cell 100 are omitted from FIGS. 4-6.

As discussed above, the example memory cell 100 is configured as a 6T SRAM cell having two inverters each coupled with an access transistor. In the present embodiments, the first inverter includes the transistors M1 and M2 coupled together, and the second inverter includes the transistors M3 and M4 coupled together, where M1 and M3 each include a PMOS transistor and M2 and M4 each include an NMOS transistor. The access transistors M5 and M6 each include an NMOS transistor.

In the present embodiments, the memory cell 100 is configured as a part of a BEOL, rather than an FEOL, network of an IC device. In other words, the memory cell 100 is formed in one or more metallization layers over a semiconductor substrate (not depicted), which may include a plurality of FEOL devices and/or features. In this regard, the memory cell 100 may alternatively be referred to as a BEOL SRAM cell 100. In accordance with various embodiments of the present disclosure, although the BEOL SRAM cell 100 may function in a similar manner as an FEOL SRAM cell (i.e., according to the example circuit diagram of FIG. 3), it is configured with a structure different from that of the FEOL SRAM cell, as discussed in detail below.

In the present embodiments, referring to FIGS. 4 and 6, the transistor M1, which is a PMOS device, includes a channel layer (hereafter referred to as "p-channel layer") 210 disposed over and engaged with a gate layer (or gate electrode) 206 such that the p-channel layer 210 is stacked over the gate layer 206 vertically along the Z axis. The transistor M1 further includes a gate dielectric layer 214 disposed between the p-channel layer 210 and the gate layer 206. Furthermore, the p-channel layer 210 is laterally interposed between the first contact 101a (i.e., Vdd) and a vertical portion of an interconnect structure 110 along the X axis, where the first contact 101a and the interconnect structure 110 each function as a source/drain of the transistor M1.

The transistor M2, which is an NMOS device, includes a channel layer (hereafter referred to as "n-channel layer") 212 engaged with the gate layer 206, where the gate layer 206 is stacked over the n-channel layer 212 vertically along the Z axis. In other words, the n-channel layer 212 and the p-channel layer 210 are disposed over opposing surfaces of the gate layer 206 along the Z axis. The transistor M2 further includes a gate dielectric layer 216 disposed between the n-channel layer 212 and the gate layer 206. In this regard, the transistor M1 is vertically stacked over the transistor M2 with their shared gate layer 206 being interposed between the p-channel layer 210 and the n-channel layer 212 along the Z axis. Furthermore, the n-channel layer 212 is laterally interposed between the second contact 103a (i.e., Vss) and the vertical portion of the interconnect structure 110 along the X axis, where the second contact 103a and the interconnect structure 110 each function as a source/drain of the transistor M2. As shown, the interconnect structure 110 extends vertically along the Z axis to couple the transistor M1 with the transistor M2, consistent with the depiction of the memory cell 100 in FIG. 3.

Still referring to FIGS. 4 and 6, the transistor M5, which is also an NMOS device, includes an n-channel layer 232 engaged with a gate layer 226, where the gate layer 226 is stacked over the n-channel layer 232 vertically along the Z axis. In other words, the n-channel layer 232 and the n-channel layer 212 are laterally adjacent one another and separated by the vertical portion of the interconnect structure 110 along the X axis. Furthermore, the n-channel layer 232 and the n-channel layer 212 are leveled, or substantially leveled, along the Z axis (i.e., disposed in the same X-Y plane), while the p-channel layer 210 and the n-channel layer 232 are offset along the Z axis (i.e., disposed in different X-Y planes spaced along the Z axis).

The transistor M5 further includes a gate dielectric layer 218 disposed between the n-channel layer 232 and the gate layer 226 (see FIG. 6), according to some embodiments. As shown, the gate layer 226 is laterally adjacent the gate layer 206 along the X axis and separated by portions of the dielectric layer 202 and the interconnect structure 110. In some embodiments, an additional gate dielectric layer 220 is formed over the gate layer 226 such that the gate dielectric layer 218 and the gate dielectric layer 220 are formed over opposite surfaces of the gate layer 226 along the Z axis. The n-channel layer 232 is interposed between the interconnect structure 110 and the BBL 109 along the X axis, where the interconnect structure 110 and the BBL 109 each function as (or are each coupled to) a source/drain of the transistor M5. Furthermore, referring to FIGS. 4 and 5, the transistor M5 is coupled to the WL 105a at the gate layer 226. Still further, consistent with the depiction of FIG. 3, the interconnect structure 110 extends vertically along the Z axis to couple together the transistors M1, M2, and M5 at a source/drain of each transistor.

To provide isolation for the gate layers 206 and 226, the dielectric layer 202 is formed adjacent each gate layer 206 and 226 along the X axis (e.g., as depicted in FIGS. 4 and 6) and along the Y axis (not depicted). For example, a portion of the dielectric layer 202 separates the gate layer 206 from the interconnect structure 110 along the X axis. In some embodiments, referring to FIG. 5, the gate layers 206 and 226 each extend away from their respective channel layers (e.g., the p-channel layer 210 and the n-channel layer 212 for the gate layer 206, and the n-channel layer 232 for the gate layer 226) along the Y axis to provide coupling of the transistors with other portions of the memory cell 100. In one example, the extended portion of the gate layer 206 provides the coupling of the transistors M1 and M2 at the node 116, which is connected to an interconnect structure 114. In another example, the extended portion of the gate layer 226 provides the coupling of the transistor M5 with the WL 105a.

Referring to FIGS. 4 and 5, the transistors M3, M4, and M6 are configured with structures similar to those of the transistors M1, M2, and M5, respectively. For example, the transistor M3, which is a PMOS device, includes a p-channel layer 240 disposed over and engaged with a gate layer 246, where a gate dielectric layer 254 is disposed between the p-channel layer 240 and the gate layer 246. The p-channel layer 240 is stacked over the gate layer 246 along the Z axis and interposed between the first contact 101b (i.e., Vdd) and a vertical portion of the interconnect structure 114 along the X axis, where the first contact 101b and the interconnect structure 114 each function as a source/drain of the transistor M3.

Referring to FIG. 4, the transistor M4, which is an NMOS device, includes an n-channel layer 252 engaged with the gate layer 246, where the gate layer 246 is stacked over the n-channel layer 252 along the Z axis. In this regard, the n-channel layer 252 and the p-channel layer 240 are disposed over opposite surfaces of the gate layer 246 along the Z axis, similar to the arrangement of the p-channel layer 210, the n-channel layer 212, and the gate layer 206. The transistor M4 further includes a gate dielectric layer (not depicted herein) similar to any of the gate dielectric layers 214, 216, 218, 220, and 254 described above. The n-channel layer 252 is interposed between the second contact 103b (i.e., Vss) and the vertical portion of the interconnect structure 114 along the X axis, where the second contact 103b and the interconnect structure 114 each function as a source/drain of the transistor M4.

Still referring to FIG. 4, the transistor M6, which is also an NMOS device, includes an n-channel layer 272 engaged with a gate layer 266, where the gate layer 266 is stacked over the n-channel layer 272 along the Z axis. In other words, the n-channel layer 272 and the n-channel layer 252 are laterally adjacent one another and separated by the interconnect structure 114 along the X axis. The transistor M6 further includes a gate dielectric layer 258 disposed between the n-channel layer 272 and the gate layer 266. In some embodiments, an additional gate dielectric layer 260 is formed over the gate layer 266 such that the gate dielectric layer 258 and the gate dielectric layer 260 are formed over opposite surfaces of the gate layer 266 along the Z axis. Additionally, the n-channel layer 272 is disposed between the interconnect structure 114 and the BL 107 along the X axis, where the interconnect structure 114 and the BL 107 each function as (or are each coupled to) a source/drain of the transistor M6. Furthermore, similar to the arrangement of the n-channel layer 212, the n-channel layer 232, and the p-channel layer 210, the n-channel layer 272 and the n-channel layer 252 are leveled, or substantially leveled, along the Z axis (i.e., disposed in the same X-Y plane), while the p-channel layer 240 and the n-channel layer 272 are offset along the Z axis (i.e., disposed in different X-Y planes spaced along the Z axis).

To provide isolation for the gate layers 246 and 266 (in the same or different memory cell 100), the dielectric layer 202 is also formed adjacent each gate layer 246 and 266 along the X axis (e.g., as depicted in FIG. 4) and along the Y axis (not depicted). For example, a portion of the dielectric layer 202 separates the gate layer 246 from the interconnect structure 110 along the X axis. In some embodiments, referring to FIG. 4 and similar to the gate layer 206 and 226, the gate layers 246 and 266 each extend away from their respective channel layers (e.g., the p-channel layer 240 and the n-channel layer 252 for the gate layer 246, and the n-channel layer 272 for the gate layer 266) along the Y axis to provide coupling of the transistors with other portions of the memory cell 100. In one example, the extended portion of the gate layer 246 provides the coupling of the transistors M3 and M4 at the node 112, which is connected to the interconnect structure 110. In another example, the extended portion of the gate layer 266 provides the coupling of the transistor M6 with the WL 105b.

In some embodiments, referring to FIG. 6, the gate layer 206, the gate dielectric layer 214, and the gate dielectric layer 216 each extend a length L1 along the X axis, while the p-channel layer 210 and the n-channel layer 212 each extend a length L2 (i.e., the channel length of each of the transistors M1 and M2) along the X axis that is greater than the length L1. In some embodiments, such a difference between the lengths L1 and L2 allows each of the p-channel layer 210 and the n-channel layer 212 to completely overlap with the gate layer 206 (and the corresponding gate dielectric layers), thereby allowing the device to operate properly. Referring back to FIG. 5, the p-channel layer 210 and the underlying n-channel layer 212 (not depicted) may each be defined by a channel width CW along the Y axis. In some embodiments, the channel widths of the p-channel layer 210 and the n-channel layer 212 are adjusted independently to different values to achieve different read or write functions in the memory cell 100.

In the present embodiments, the first inverter of the memory cell 100 includes a common gate (e.g., the gate layer 206 and the corresponding gate dielectric layers) engaged with a p-channel layer (e.g., the p-channel layer 210) and an n-channel layer (e.g., the n-channel layer 212) in a vertical stack to form the transistors M1 and M2, respectively. Similarly, the second inverter of the memory cell 100 includes a common gate (e.g., the gate layer 246 and the corresponding gate dielectric layers) engaged with a p-channel layer (e.g., the p-channel layer 240) and an n-channel layer (e.g., the n-channel layer 252) in a vertical stack to form the transistors M3 and M4, respectively.

In the present embodiments, the interconnect structure 110 corresponds to the QB node and the interconnect structure 114 corresponds to the Q node, as depicted in FIG. 3. Each of the interconnect structures 110 and 114 includes a vertical portion that extends along the Z axis, a first lateral portion that extends along the X axis, and a second lateral portion that extends along the Y axis. As such, the interconnect structures 110 and 114, as portions of a BEOL network, provide connections between the transistors of different vertical stacks within the memory cell 100, thereby allowing the transistors to be arranged in a 3D configuration rather than a planar configuration and reducing the demand for chip area and cost associated with device fabrication.

Figure 7:
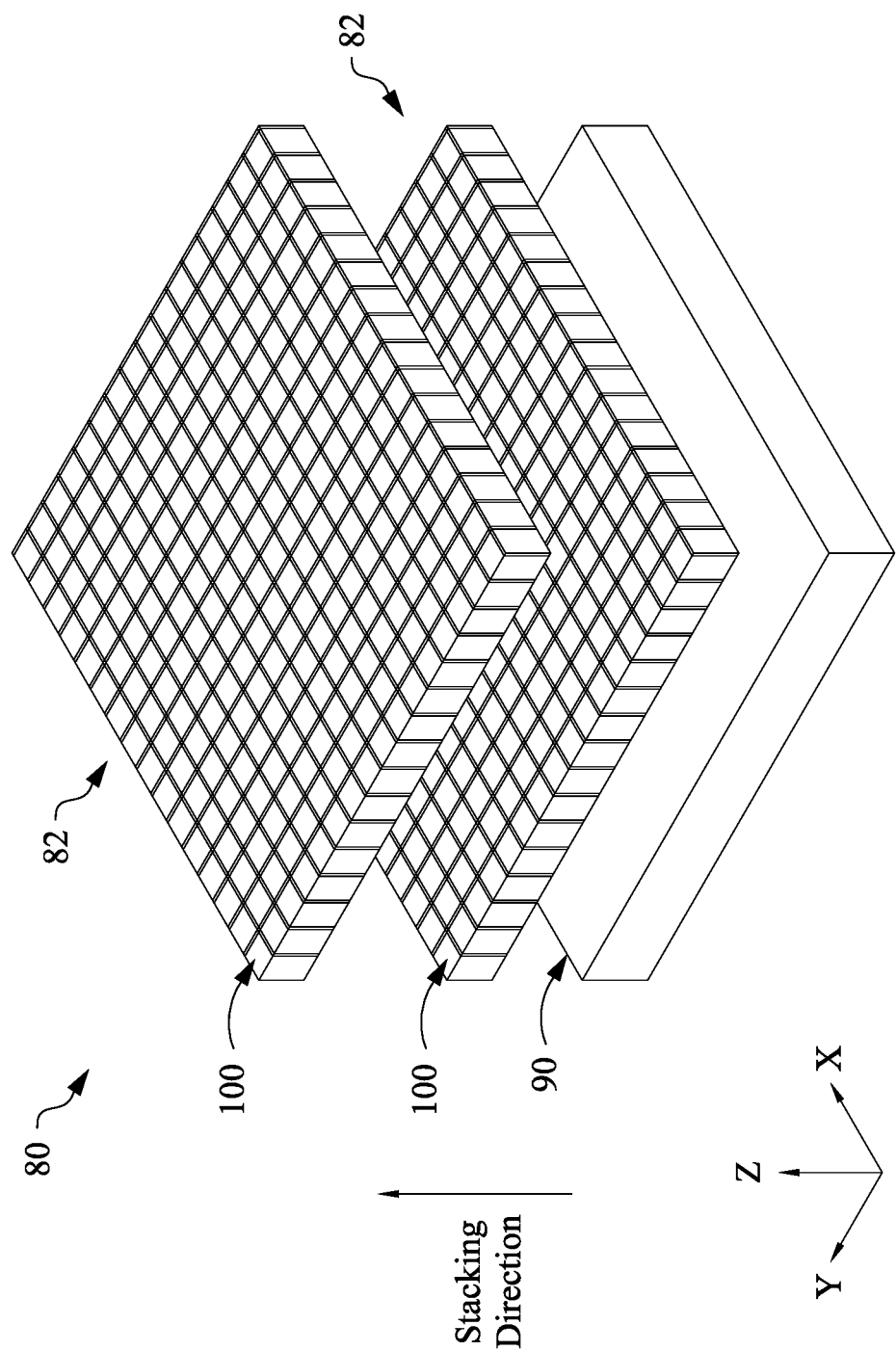
FIG. 7 illustrates a 3D perspective view of an example semiconductor device including a plurality of memory cells arranged in a stacked configuration, in accordance with some embodiments.

Referring to FIG. 7, a schematic of an example semiconductor device 80 is illustrated. The semiconductor device 80 includes a plurality of memory arrays 82 coupled to one or more PC 90, each of which may be similar to the PC 20. In the depicted embodiments, the PC 90 are disposed below the memory arrays 82. Each memory array 82 includes a plurality of memory cells 100 as described herein. In the present embodiments, the semiconductor device 80 differs from the semiconductor device 50 in that the memory arrays 82 (i.e., the memory cells 100) are stacked vertically along a stacking direction, i.e., the Z axis as depicted, resulting in the semiconductor device 80 to have a 3D stacked configuration rather than a planar configuration, as in the case of the semiconductor device 50.

For purposes of discussion, the stacking direction of the memory arrays 82 points away from a semiconductor substrate (not depicted) of the semiconductor device 80, where the semiconductor substrate is disposed below the memory arrays 82 (e.g., at the same level as or below the PC 90). In this regard, for two adjacent memory arrays 82 (or memory cells 100) disposed along the stacking direction, the memory array 82 (or memory cell 100) closer to the semiconductor substrate may be considered a bottom memory array 82 (or bottom memory cell 100) and the other memory array 82 (or memory cell 100) farther away from the semiconductor substrate may be considered a top memory array 82 (or top memory cell 100). This convention in the stacking direction also applies to transistors within each memory cell 100. For example, the transistors closer to the semiconductor substrate are disposed at a bottom level of the memory cell 100, and the transistor farther away from the semiconductor substrate are disposed at a top level of the memory cell 100.

Figure 8:
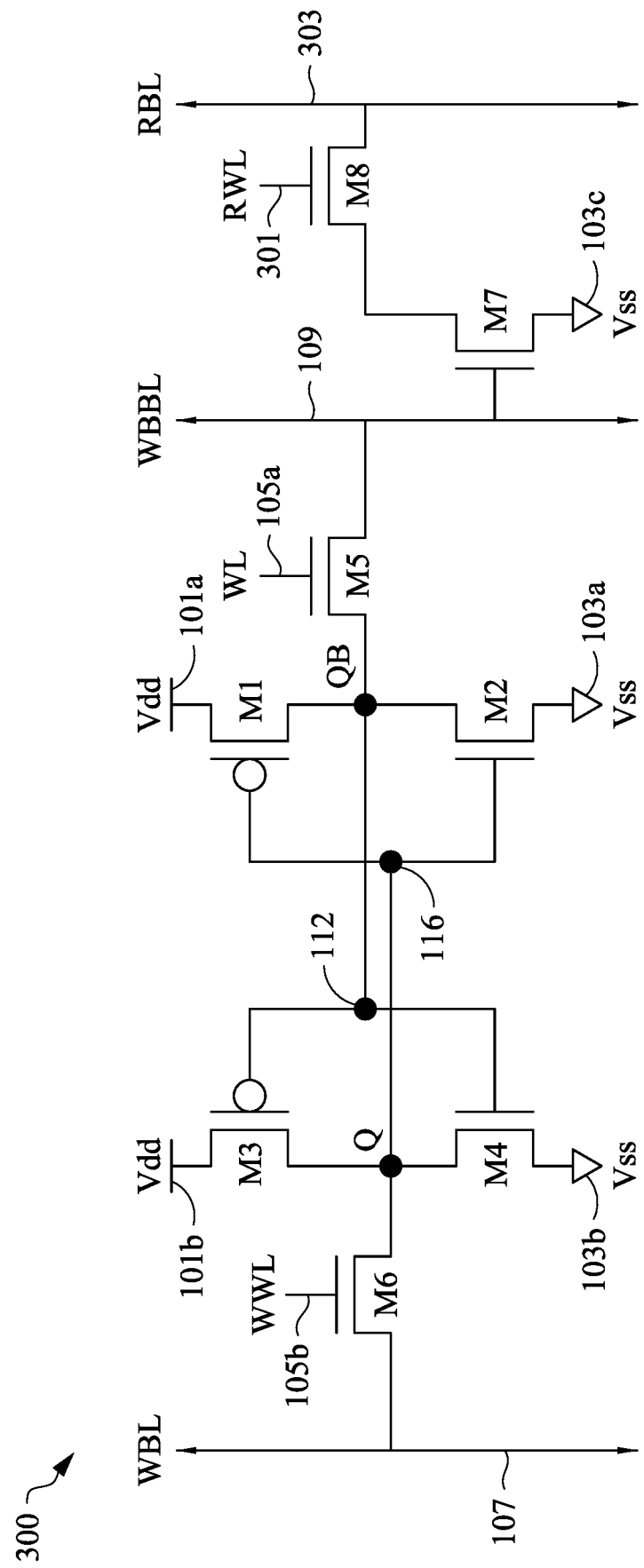
FIG. 8 illustrates an example circuit diagram, in accordance with some embodiments.

Referring to FIG. 8, an example circuit diagram of a memory cell 300 is illustrated. The memory cell 300 is similar to the example circuit diagram of a memory cell 100 of FIG. 3 except that the memory cell 300 includes two additional transistors (a pull-down transistor M7 and an access transistor M8), such that the memory cell 300 is referred to as an eight-transistor (8T) SRAM cell.

As shown, a gate of the pull-down transistor (hereafter referred to as transistor) M7 is coupled to the output of the first inverter formed by the transistors M1 and M2. One of the source/drain of the access transistor (hereafter referred to as transistor) M8 is coupled to a drain of the transistor M7. A source of the transistor M7 is coupled to ground, which is another one of the second contacts 103c, or Vss. In some embodiments, the transistor M7 can be implemented as a pull-up transistor. A gate of the transistor M8 is coupled to a read word line (RWL) 301. A second one of the source/drain of the transistor M8 is coupled to the read bit line (RBL) 303. The WL 105a/105b, the BL 107, and the BBL 109 are herein referred to as write word line (WWL) 105, write bit line (WBL) 107, and write bit bar line (WBBL) 109, respectively.

In some embodiments, as depicted herein, the memory cell 300 includes six NMOS transistors and two PMOS transistors, where two of the NMOS transistors are configured as a read port. In some embodiments, the memory cell 100 includes two NMOS transistors and six PMOS transistors, where two of the PMOS transistors are configured as a read port. In some embodiments, the memory cell 100 includes four NMOS transistors and four PMOS transistors, where two of the NMOS transistors or two of the PMOS transistors are configured as a read port. In some embodiments, the memory cell 300 may include more than eight transistors, such as ten transistors for forming a ten-transistor (10T) SRAM cell.

To read the logical state of the data bit stored in the memory cell 300, the RBL 303 is pre-charged to Vdd. Then the RWL 301 is asserted, or activated, by an assert signal to a logical high, which turns on the access transistor M8. Once the transistor M8 is turned on, based on the logical state of the data bit, the pre-charged RBL 303 may start to be discharged. In some embodiments, a sensing amplifier, coupled to the RBL 303 and a reference voltage, can use a polarity of a voltage difference between the RBL 303 and the reference voltage to determine whether the logical state of the data bit is a logical 1 or a logical 0. To write the logical state of the data bit stored in the memory cell 300, the same operations are performed that are performed in the memory cell 100 of FIG. 3.

Figure 9:
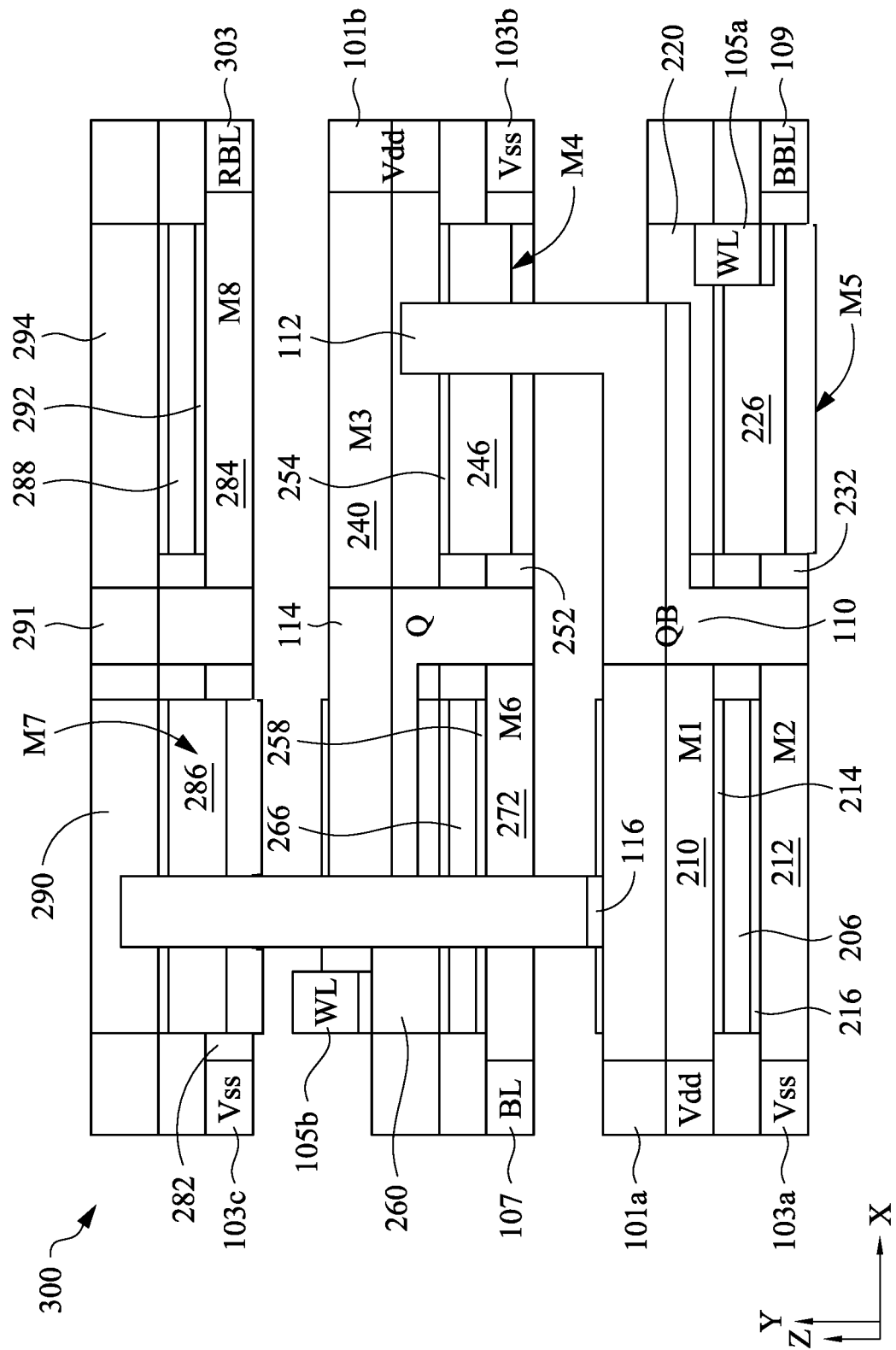
FIG. 9 illustrates a 3D perspective view of an example memory cell corresponding to the circuit diagram of FIG. 8, in accordance with some embodiments.
Figure 10:
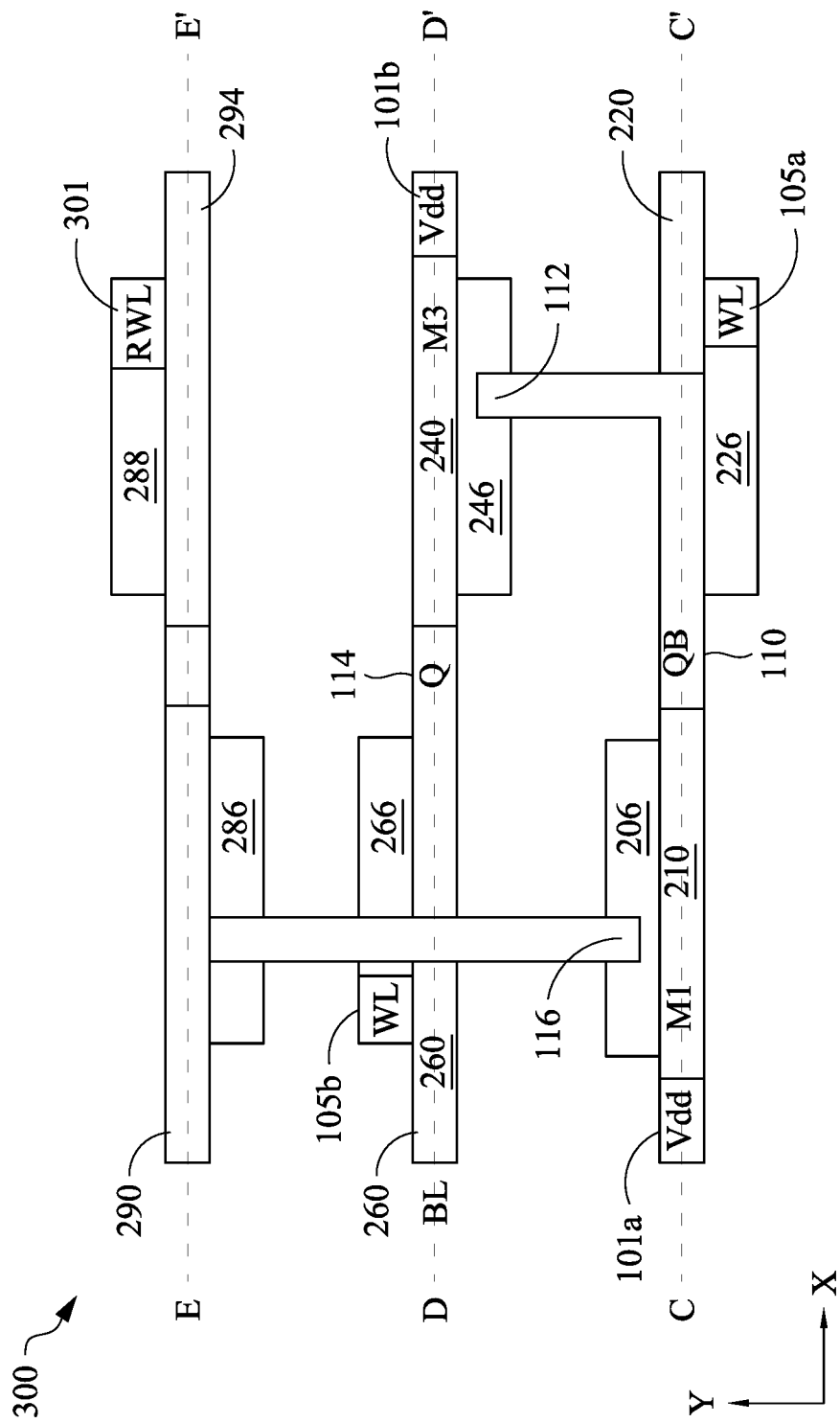
FIG. 10 illustrates a planar top view of the memory cell of FIG. 9, in accordance with some embodiments.

Referring to FIGS. 9 and 10 collectively, an embodiment of the memory cell 300 showing detailed arrangement of various elements is illustrated. FIG. 9 depicts a 3D perspective view of the memory cell 300, and FIG. 10 depicts a top view of the memory cell 300 in the X-Y plane. It is noted that portions of the memory cell 300 may be omitted for purposes of clarity. For example, portions of the dielectric layer 202 surrounding various components of the memory cell 300 are omitted from FIGS. 9 and 10. It is further noted that the memory cell 300 is structurally similar to the memory cell 100 according to the present embodiments. For example, six of the eight transistors of the memory cell 300 are arranged in the same manner as the transistors M1-M6 of the memory cell 100. Accordingly, for purposes of brevity only portions of the memory cell 300 that differ from the structure of the memory cell 100, namely the transistors M7 and M8, are discussed in detail below, and components of the memory cell 300 similar to those of the memory cell 100 are described using the same reference numerals.

The transistors M7 and M8 each have a structure similar to that of the transistors M5 or M6 discussed in detail above. For example, according to some embodiments, the transistor M7 is an NMOS device that includes an n-channel layer 282 engaged with a gate layer 286, where the gate layer 286 is vertically stacked over the n-channel layer 282 along the Z axis. The transistor M7 further includes a gate dielectric layer (not depicted herein) disposed between the n-channel layer 282 and the gate layer 286. As shown, the gate layer 286 is laterally adjacent a gate layer 288 of the transistor M8 along the X axis and separated by portions of the dielectric layer 202 and a third contact 291 that couples the transistor M7 to the transistor M8. In some embodiments, an additional gate dielectric layer 290 is formed over the gate layer 286. The n-channel layer 282 is interposed between the second contact 103c and the third contact 291 along the X axis, where the second contact 103c and the third contact 291 each function as (or are each coupled to) a source/drain of the transistor M7. Furthermore, as shown in FIGS. 9 and 10, the coupled transistors M7 and M8 are further coupled to the interconnect structure 114 at the gate layer 286. In this regard, the interconnect structure 114 extends along the Y axis to couple the gate layer 286 to the gate layer 266 of the transistor M6 and the gate layer 206 of the transistor M1.

In some embodiments, the transistor M8 is an NMOS device that includes an n-channel layer 284 engaged with a gate layer 288, where the gate layer 288 is stacked over the n-channel layer 284 vertically along the Z axis. The transistor M8 further includes a gate dielectric layer 292 disposed between the n-channel layer 284 and the gate layer 288. As shown, the gate layer 288 is laterally adjacent the gate layer 286 of the transistor M7 along the X axis and separated by portions of the dielectric layer 202 and the third contact 291 that couples the transistor M7 to the transistor M8. In some embodiments, an additional gate dielectric layer 294 is formed over the gate layer 286 such that the gate dielectric layers 292 and 294 are disposed over opposite surfaces of the gate layer 288 along the Z axis. The n-channel layer 284 is interposed between the third contact 291 and the RBL 303 along the X axis, where the third contact 291 and the RBL 303 each function as (or are each coupled to) a source/drain of the transistor M8. Furthermore, as shown in FIG. 10, the RWL 301 is coupled to a portion of the gate layer 288 that extends away from the n-channel layer 284 along the Y direction.

Figure 11:
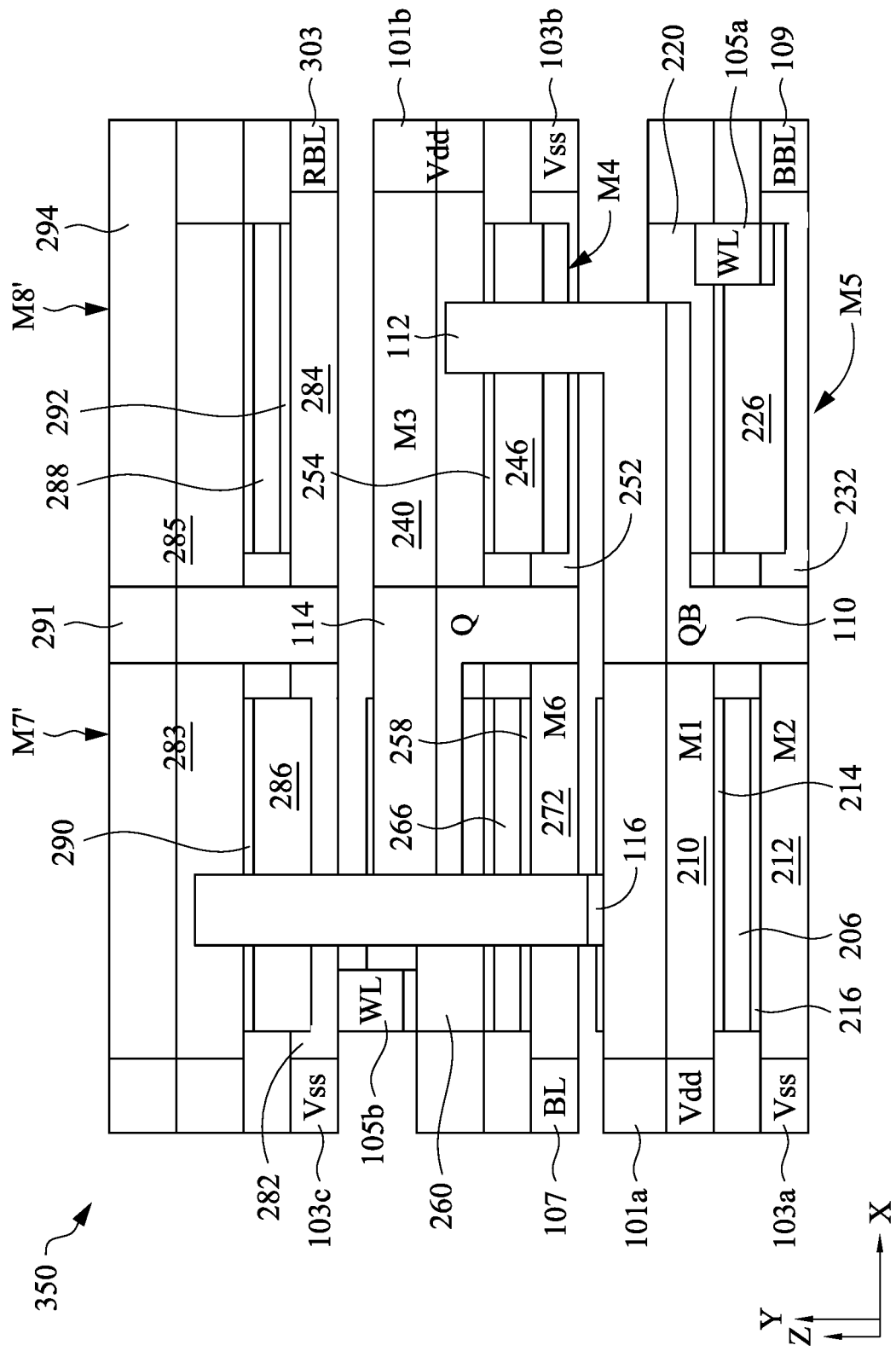
FIG. 11 illustrates a 3D perspective view of an example memory cell corresponding to the circuit diagram of FIG. 8, in accordance with some embodiments.

Referring to FIG. 11, an embodiment of an example memory cell 350 is illustrated in a 3D perspective view. The memory cell 350 is similar to the memory cell 300 of FIGS. 9 and 10 in that the memory cell 350 includes eight transistors coupled together according to the circuit diagram of FIG. 8 and is therefore considered an 8T SRAM cell. However, different from the memory cell 300, the memory cell 350 includes two dual-channel NMOS devices, M7' and M8', that correspond to the transistors M7 and M8, respectively, of the memory cell 300. In some embodiments, the transistor M7' is a pull-down transistor having two n-channels layers 282 and 283 engaged with the gate layer 286. The n-channel layer 282, the gate layer 286, and the n-channel layer 283 are arranged in a vertical stack along the Z axis in a configuration similar to that of the transistors M1 and M2, for example. Similarly, the transistor M8' is an access transistor having two n-channel layers 284 and 285 engaged with the gate layer 288 and arranged in a vertical stack along the Z axis. In some embodiments, by employing the dual-channel structures, the transistors M7' and M8' are configured as double read-port NMOS devices in the memory cell 350 with increased channel lengths to achieve greater device speed.

In some embodiments, the stacked configurations of the various transistors in the example memory cells 100, 300, and 350 can be adjusted to accommodate different design requirements and device routing architectures. Referring to each of FIGS. 12-15, a schematic cross-sectional view along each of lines A-A' and B-B' of the memory cell 100 as shown in FIG. 5 is illustrated with respect to the stacking direction (i.e., the Z axis) defined above in reference to FIG. 7. The lines A-A' and B-B' are each taken through one of the inverters and its corresponding access transistor of the memory cell 100 along the X axis. Referring to each of FIGS. 16-19, a schematic cross-sectional view along each of lines C-C', D-D', and E-E' of the memory cell 300 as shown in FIG. 10 is illustrated with respect to the stacking direction defined in reference to FIG. 7. For illustrative purposes, the transistors M1 and M3 of the memory cells 100 and 300 are collectively referred to as PMOS devices, and the transistors M2-M8 of the memory cells 100 and 300 are collectively referred to as NMOS devices. The lines C-C' and D-D' are each taken through one of the inverters and its corresponding access transistor along the X axis, and the line D-D' is taken through the transistors M7 and M8 of the memory cell 300 along the X axis.

Figure 12:
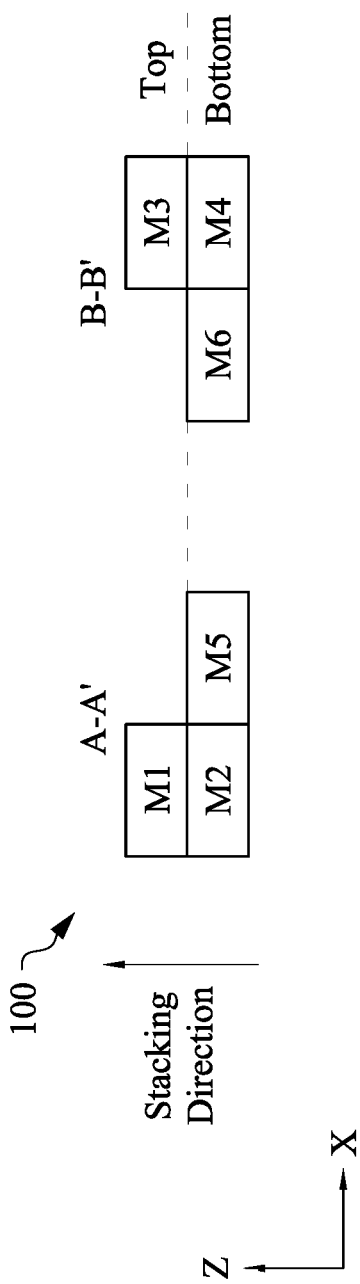
FIGS. 12, 13, 14, and 15 each illustrate cross-sectional views of the memory cell of FIG. 5 along lines A-A' and B-B', in accordance with some embodiments.
Figure 13:
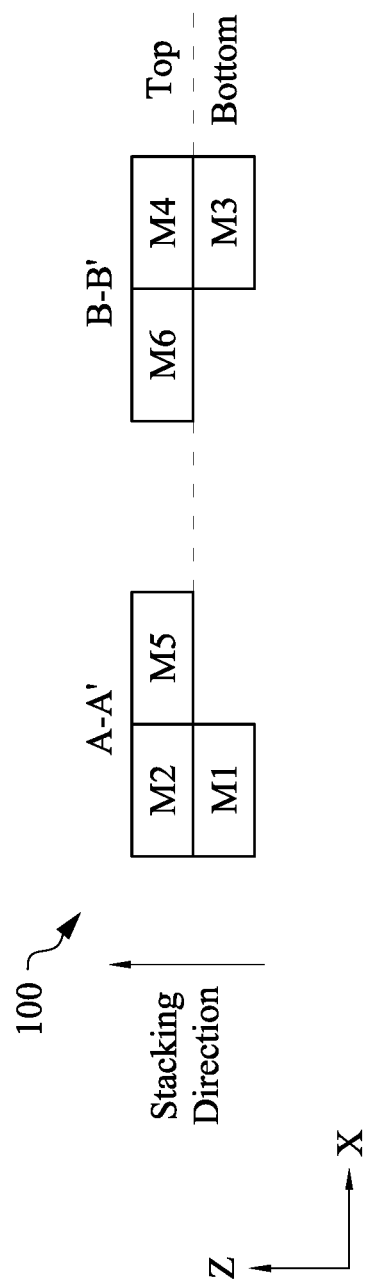
Figure 14:
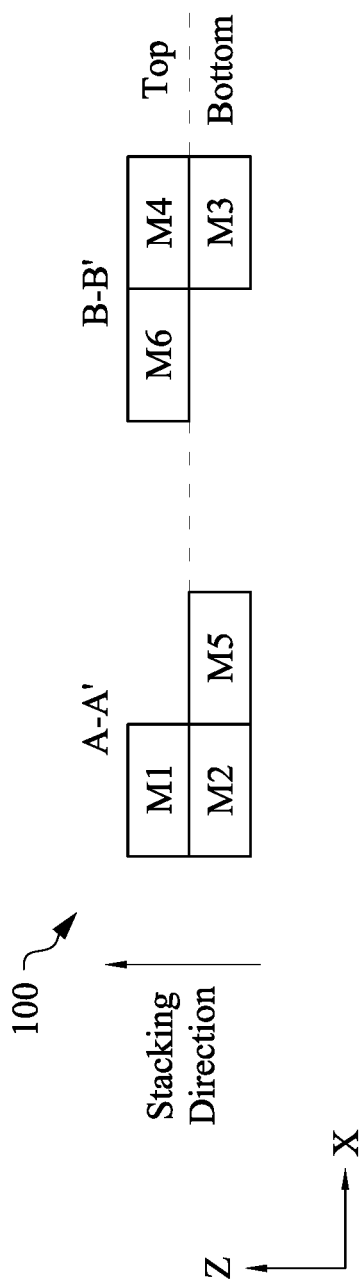
Figure 15:
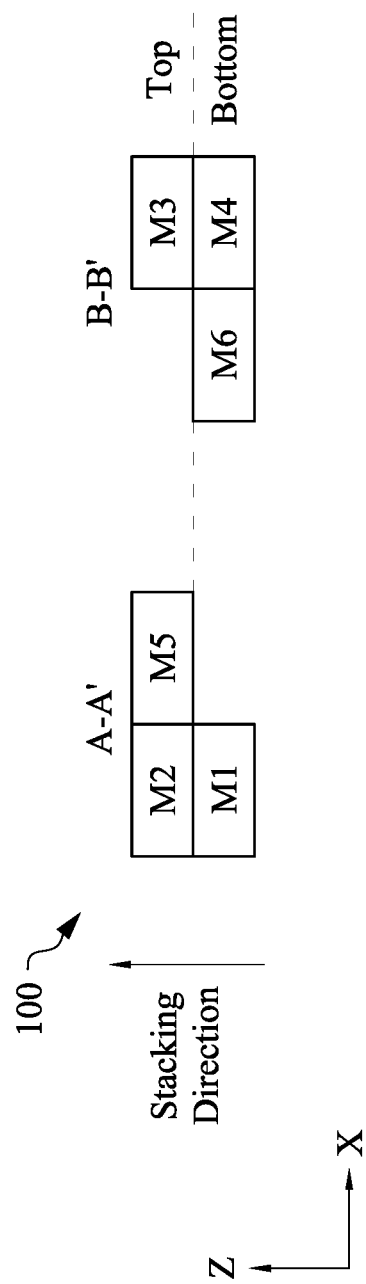

In some embodiments, referring to FIG. 12, both of the PMOS devices are disposed at a top level of the memory cell 100, while their corresponding NMOS devices are disposed at a bottom level of the memory cell 100. This configuration is consistent with that depicted in FIGS. 4-6. In some embodiments, referring to FIG. 13, positions of both of the PMOS devices are inverted with those of the NMOS devices along the stacking direction (with respect to the configuration of FIG. 12), such that the PMOS devices are disposed at the bottom level and the NMOS devices are disposed at the top level of the memory cell 100. In some embodiments, referring to FIGS. 14 and 15, the position of one of the PMOS devices is inverted with its corresponding NMOS devices, while the positions of the other one of the PMOS devices and its corresponding NMOS devices remain the same as in the configuration of FIG. 12.

Figure 16:
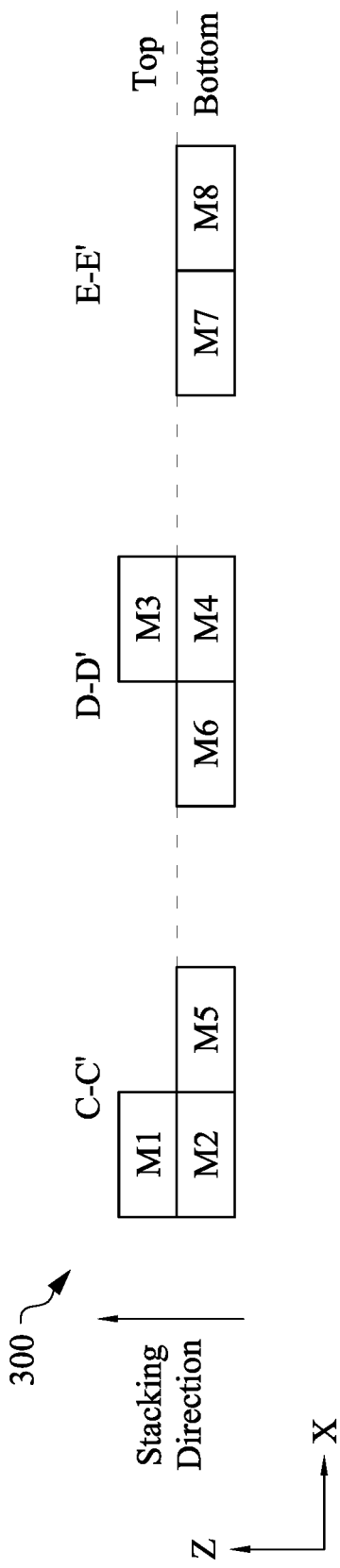
FIGS. 16, 17, 18, and 19 each illustrate cross-sectional views of the memory cell of FIG. 10 along lines C-C', D-D', and E-E', in accordance with some embodiments.
Figure 17:
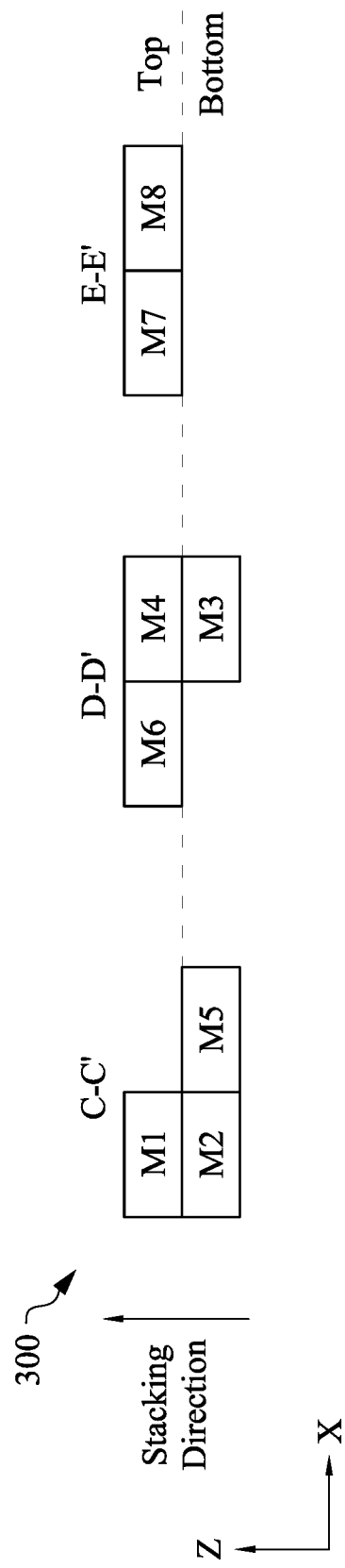
Figure 18:
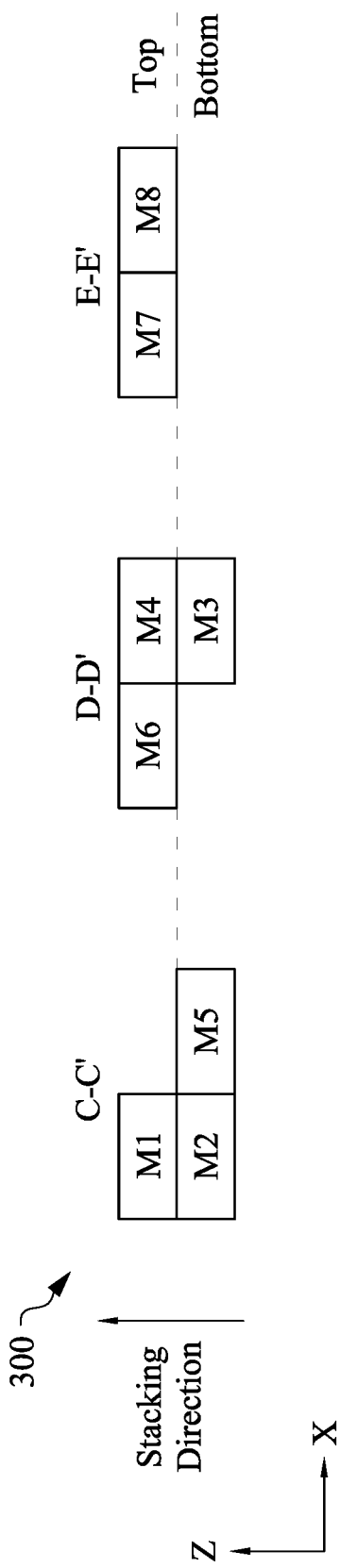
Figure 19:
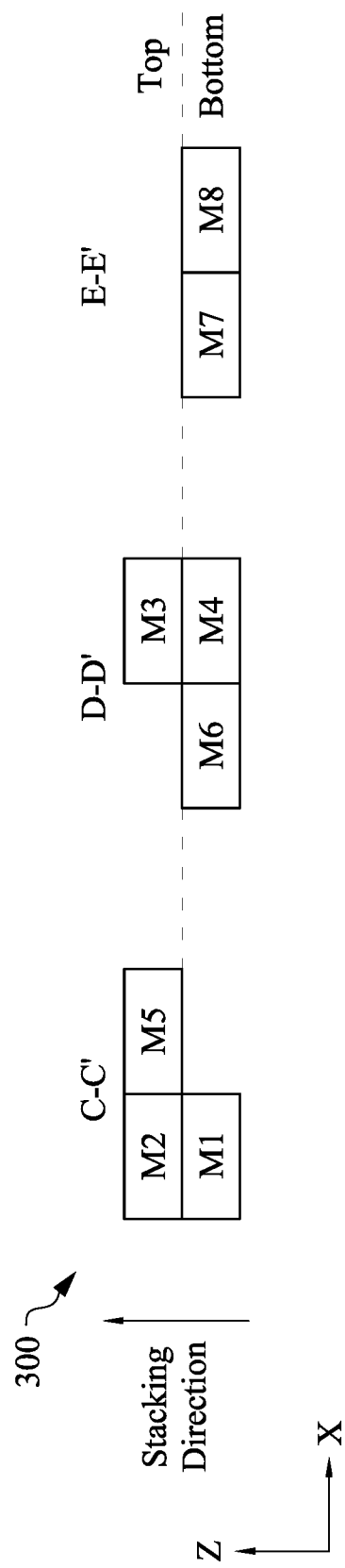

In some embodiments, referring to FIG. 16, both of the PMOS devices are disposed at a top level of the memory cell 300, while the NMOS devices are disposed at a bottom level of the memory cell 300. This configuration is consistent with that depicted in FIGS. 9 and 10. In some embodiments, referring to FIG. 17, positions of both of the PMOS devices are inverted with those of the NMOS devices along the stacking direction (with respect to the configuration of FIG. 16), such that the PMOS devices are disposed at the bottom level and the NMOS devices are disposed at the top level of the memory cell 300. In some embodiments, referring to FIGS. 18 and 19, the position of one of the PMOS devices is inverted with its corresponding NMOS devices, while the positions of the other one of the PMOS devices and its corresponding NMOS devices remain the same as in the configuration of FIG. 16. The transistors M7 and M8, which are both NMOS devices, may be disposed at the same level as the other NMOS devices. In some embodiments, the stacked configurations of the transistors M1-M6 of the memory cell 350 can be adjusted in a manner similar to that of the transistors M1-M6 of the memory cell 300 described herein.

Figure 20:
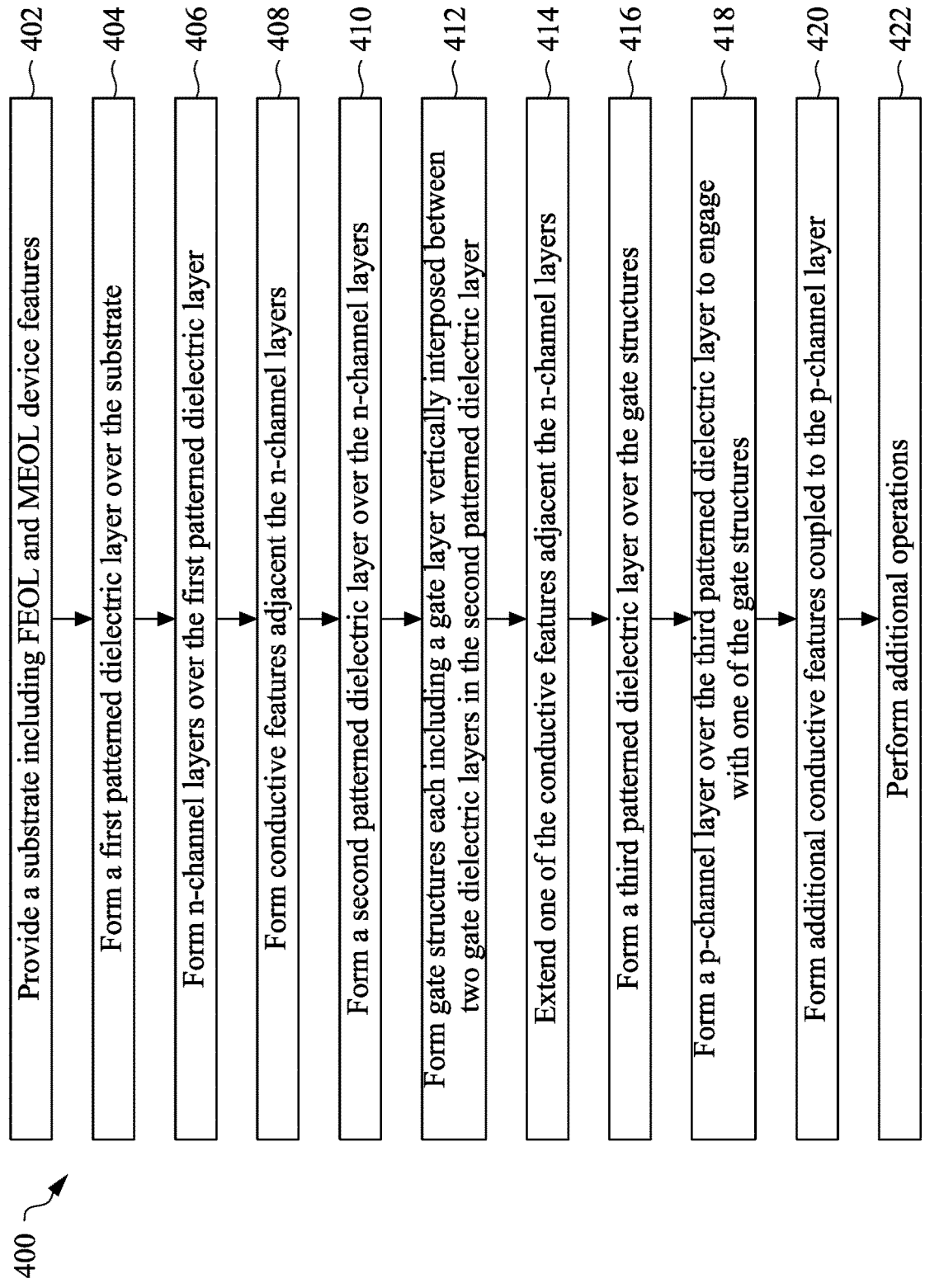
FIG. 20 illustrates an example method of forming the memory cell of FIG. 4, 9, or 10, in accordance with some embodiments.

FIG. 20 is a flowchart of a method 400 of forming a memory cell (e.g., a semiconductor structure) 500, in accordance with some embodiments. Operations of the method 400 are described in reference to FIGS. 21-39, which depict cross-sectional views of a portion of the memory cell 500 at intermediate stages of the method 400, according to some embodiments. The memory cell 500 may be formed in accordance with the memory cells 100, 300, or 350 as depicted in one or more of FIGS. 3-19. For example, FIGS. 21-39 illustrate cross-sectional views of the memory cell 500 that each resemble the cross-sectional view of the memory cell 100 as depicted in FIG. 6, which is taken along the line A-A' of FIG. 5. In this regard, components of the memory cell 500 similar to those of the memory cells 100, 300, and 350 are described using the same reference numerals. Furthermore, for purposes of clarity and brevity, only a portion of the memory cell 500 is depicted in reference to the description of the method 400, while other portions of the memory cell 500 may be formed alongside the portion shown in FIGS. 21-39.

In some embodiments, the operations of method 400 are performed in the order depicted in FIG. 20. In some embodiments, some of the operations of method 400 are performed simultaneously and/or in an order other than the order depicted in FIG. 20. In some embodiments, one or more operations are performed before, between, during, and/or after performing one or more operations of method 400.

Figure 21:
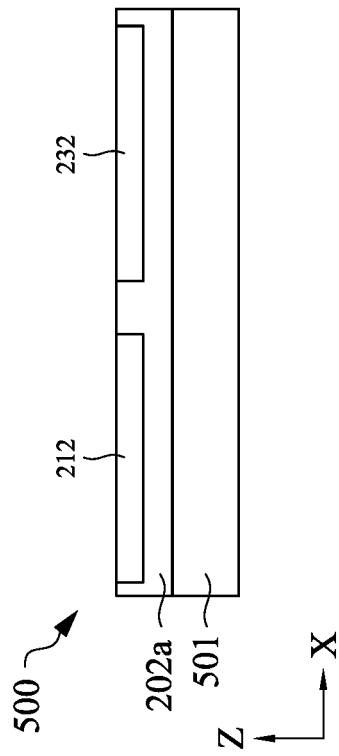

Referring to FIGS. 20 and 21, the method 400 at operation 402 provides the memory cell 500 including a substrate 501, where the substrate 501 includes a plurality of device features (e.g., transistors, diodes, resistors, etc.) formed as a part of the FEOL network. Such device features may be formed along a major surface of the substrate 501. The substrate 501 may include a semiconductor material, such as a bulk semiconductor, a semiconductor-on-insulator (SOI), or the like, which may be doped (e.g., with a p-type or an n-type dopant) or undoped. In some examples, the substrate 501 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; other suitable materials; or combinations thereof.

The substrate 501 may include a middle-end-of-line (MEOL) network of features configured to interconnect the FEOL network with the BEOL network within which a plurality of the BEOL SRAM cells (e.g., memory cells 100, 300, and 350) are provided. The MEOL network may include various contact features, such as source/drain contacts and gate contacts, coupled to the device features of the FEOL network. For purposes of clarity, the device features of the FEOL and MEOL networks are omitted in the depicted embodiments.

Still referring to FIGS. 20 and 21, the method 400 at operation 404 forms a first patterned dielectric layer 202a over the substrate 501, where the first patterned dielectric layer 202a includes trenches 502 and 503. The first patterned dielectric layer 202a may be an interlayer dielectric (ILD) layer or an intermetal dielectric (IMD) layer and include any suitable dielectric material, such as an oxide (e.g., silicon oxide), a nitride (e.g., silicon nitride), a low-k dielectric material (a dielectric material having a dielectric constant less than that of silicon oxide, which is about 3.9), the like, or combinations thereof. The first patterned dielectric layer 202a may be formed using a series of deposition, lithography, and etching processes, which include depositing a dielectric layer over the substrate 501 (by a process such as spin coating, chemical vapor deposition (CVD), flowable CVD, etc.), forming a photoresist layer (not depicted) over dielectric layer, exposing the photoresist layer to a suitable light source, developing the photoresist layer to form a patterned photoresist layer, etching the dielectric layer using the patterned photoresist layers as an etch mask to form the first patterned dielectric layer 202a, and subsequently removing the patterned photoresist layers by a suitable method, such as resist stripping or plasma ashing.

Figure 22:
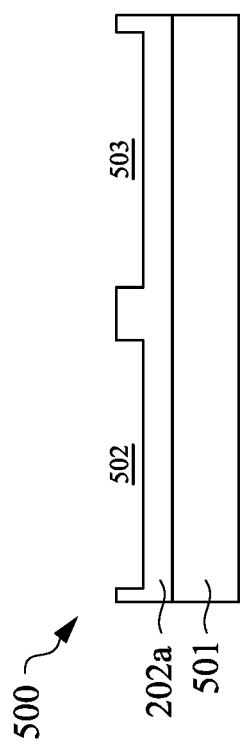

Referring to FIGS. 20 and 22, the method 400 at operation 406 forms the n-channel layers 212 and 232 in the trenches 502 and 503, respectively. In some embodiments, other n-channel layers disposed at the same level as the n-channel layers 212 and 232, such as the n-channel layers 252, 272, 282, and 284, are also formed at operation 406.

The n-channel layers 212 and 232 include a doped or undoped semiconductor material, such as indium gallium zinc oxide (IGZO), zinc oxide (ZnO), indium oxide (In$_2$O$_3$), tin oxide (SnO$_2$), indium gallium arsenide (InGaAs), carbon nanotube (CNT), transition metal dichalcogenides (TMD), black phosphorus nanoribbon (BPNR), the like, or combinations thereof. To form the n-channel layers 212 and 232, a suitable dielectric material provided herein may be deposited over the first patterned dielectric layer 202a by any suitable deposition process, such as CVD, atomic layer deposition (ALD), physical vapor deposition (PVD), the like, or combinations thereof, to fill the trenches 502 and 503. A planarization process, such as a chemical-mechanical polishing/planarization (CMP) process, may be performed subsequently to form the n-channel layers 212 and 232.

Figure 23:
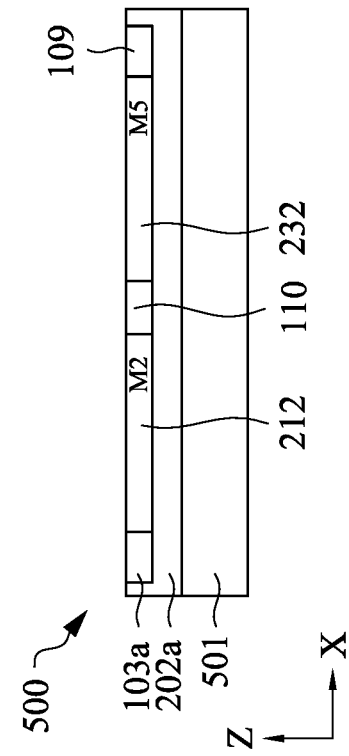
Figure 24:
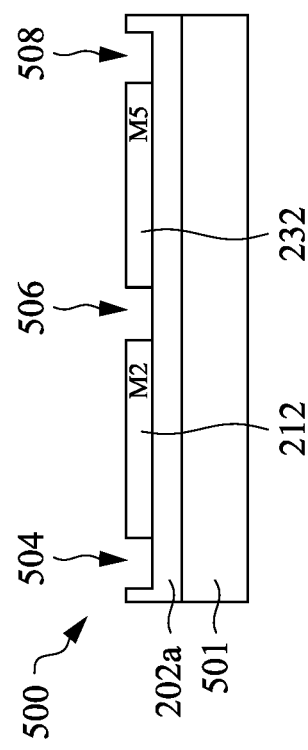

Referring to FIGS. 20, 23, and 24, the method 400 at operation 408 forms conductive features including, for example, the second contact 103a, the BBL 109, and a lower portion of the interconnect structure 110, adjacent the n-channel layers 212 and 232 in the first patterned dielectric layer 202a. In some embodiments, other conductive features disposed at the same level as the second contact 103a, the BBL 109, and the lower portion of the interconnect structure 110, such as the BL 107, the second contact 103b, a lower portion of the interconnect structure 114, the RBL 303, and the second contact 103c, are also formed at operation 408.

Referring to FIG. 23, portions of first patterned dielectric layer 202a adjacent the n-channel layers 212 and 232 are patterned to form trenches 504, 506, and 508 by any suitable patterning process, such as that described herein with respect to forming the first patterned dielectric layer 202a. Subsequently, referring to FIG. 24, a conductive material is deposited over the first patterned dielectric layer 202a to fill the trenches 504-508 and subsequently planarized by a CMP process, for example, to form the second contact 103a, the BBL 109, and the lower portion of the interconnect structure 110 adjacent the n-channel layers 212 and 232.

The conductive material may include any suitable material, such as tungsten (W), aluminum (Al), polysilicon, ruthenium (Ru), cobalt (Co), copper (Cu), tantalum nitride (TaN), titanium nitride (TiN), the like, or combinations thereof. The conductive material may be deposited by any suitable method, such as CVD, ALD, PVD, electroplating, electroless plating, the like, or combinations thereof. A barrier layer and/or a seed layer may be first formed in the trenches 504-508 before depositing the conductive material.

Referring to FIGS. 20, 25, and 26, the method 400 at operation 410 forms a second patterned dielectric layer 202b over the memory cell 500. The second patterned dielectric layer 202b exposes at least portions of the n-channel layers 212 and 232 in trenches 510 and 512, respectively, where gate layers are subsequently formed. The second patterned dielectric layer 202b has a composition similar to that of the first patterned dielectric layer 202a and may be formed in a manner similar to that of the first patterned dielectric layer 202a.

In some embodiments, the trenches 510 and 512 are the same, or substantially the same, in dimension. For example, the trenches 510 and 512 are each defined by the length L1 along the X axis, corresponding to a length of the gate layer formed therein. Each of the n-channel layers 212 and 232 is defined by the length L2 along the X axis, where the length L2 is greater than the length L1.

Referring to FIGS. 20 and 27, the method 400 at operation 412 forms the gate layers 206 and 226 in the trenches 510 and 512, respectively. In some embodiments, other gate layers (and their corresponding gate dielectric layers) disposed at the same level as the gate layers 206 and 226, such as the gate layers 246, 266, 286, and 288, are also formed at operation 412.

The gate dielectric layers 216 and 218 are first formed in the trenches 510 and 512, respectively, before forming the gate layers 206 and 226. The gate dielectric layers 214 and 220 are subsequently formed in the trenches 510 and 512, respectively, after forming the gate layers 206 and 226. In this regard, the gate layer 206 is interposed between the gate dielectric layers 214 and 216, and the gate layer 226 is interposed between the gate dielectric layers 218 and 220 along the Z axis. The resulting gate layer 206 engages with the n-channel layer 212 to form the transistor M2, and the gate layer 226 engages with the n-channel layer 212 to from the transistor M5.

The gate dielectric layers 214, 216, 218, and 220 may each include any suitable dielectric material, such as silicon oxide ($SiO_2$), silicon oxynitride (SiON), or a high-k dielectric material (a dielectric material having a dielectric constant greater than that of silicon oxide, which is about 3.9) including an oxide or silicate of Hf, Al, Zr, La, Mg, Ba, Ti, Pb, the like, or combinations thereof. Non-limiting examples of the high-k dielectric material include hafnium oxide ($HfO_2$) and aluminum oxide ($Al_2O_3$). The gate layers 206 and 226 may include any suitable conductive material, such as W, Al, polysilicon, TaN, TiN, the like, or combinations thereof. The gate dielectric layers 214-220 and the gate layers 206 and 226 may be formed by any suitable deposition process, such as CVD, ALD, PVD, electroplating, electroless plating, the like, or combinations thereof.

Figure 29:
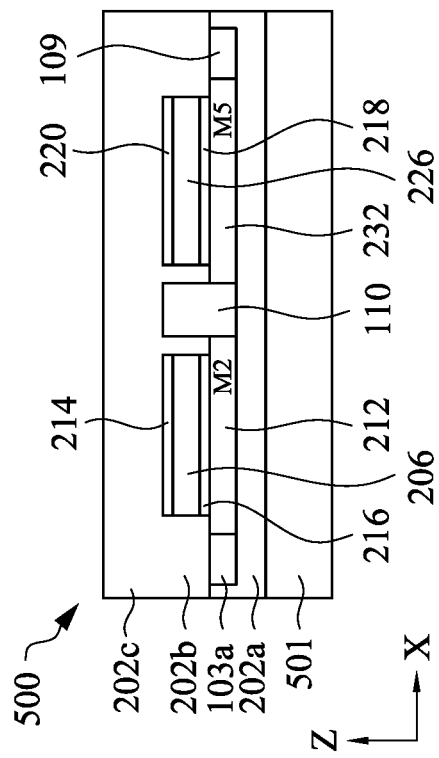

Referring to FIGS. 20, 28 and 29, the method 400 at operation 414 extends the lower portion of the interconnect structure 110 vertically along the Z axis such that the vertical portion the interconnect structure 110 is disposed between the gate layers 206 and 226. In some embodiments, the interconnect structure 114 is also vertically extended along the Z axis at operation 414.

Referring to FIG. 28, the second patterned dielectric layer 202b is first patterned to form a trench 514 between the n-channel layers 212 and 232 to expose the lower portion of the interconnect structure 110. The trench 514 may be formed by a patterning process similar to that of forming the first patterned dielectric layer 202a. Referring to FIG. 29, the conductive material having a composition consistent with the lower portion of the interconnect structure 110 described above is deposited over the second patterned dielectric layer 202b to fill the trench 514. A planarization process may be performed subsequently to form the vertically extended interconnect structure 110.

Figure 30:
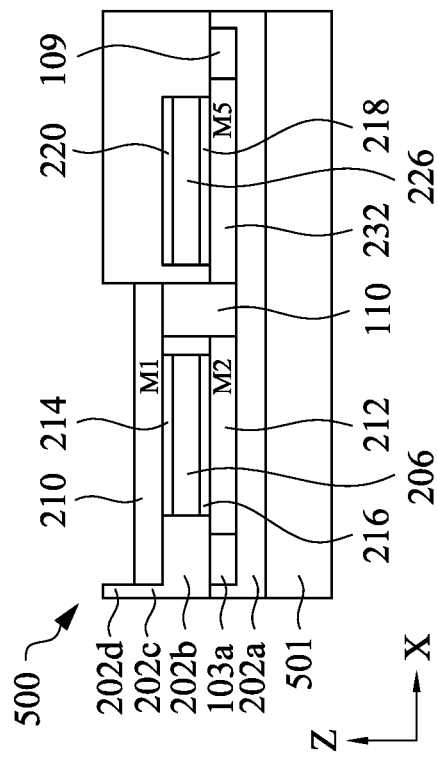
Figure 31:
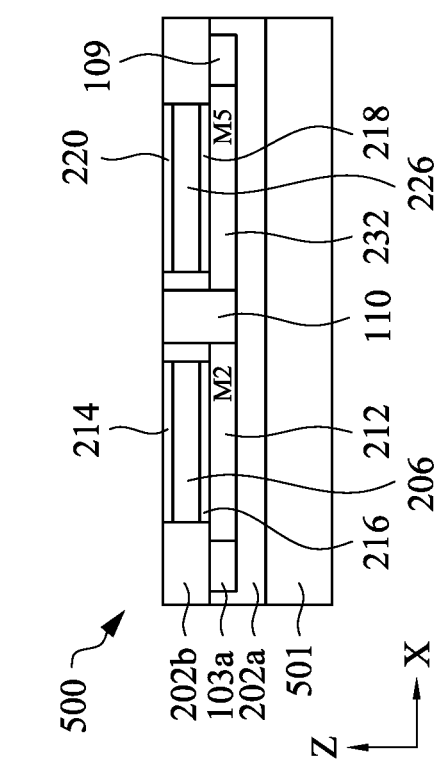

Referring to FIGS. 20, 30, and 31, the method 400 at operation 416 forms a third patterned dielectric layer 202c over the gate dielectric layer 214 and 220. Referring to FIG. 30, a dielectric layer is first deposited as a blanket layer over the memory cell 500, and subsequently, referring to FIG. 31, the dielectric layer is patterned to form a trench 518. The third patterned dielectric layer 202c may include a dielectric material similar to that of the first patterned dielectric layer 202a and may be deposited and patterned in a manner similar to that of the first patterned dielectric layer 202a. It is noted that the third patterned dielectric layer 202c only exposes the gate layer 206 (and its corresponding gate dielectric layers) over the n-channel layer 212 and does not expose the gate layer 226 (or its corresponding gate dielectric layers) over the n-channel layer 232. In the present embodiments, the trench 518 corresponds to a position of the p-channel layer 210 formed over the gate layer 206.

Figure 32:
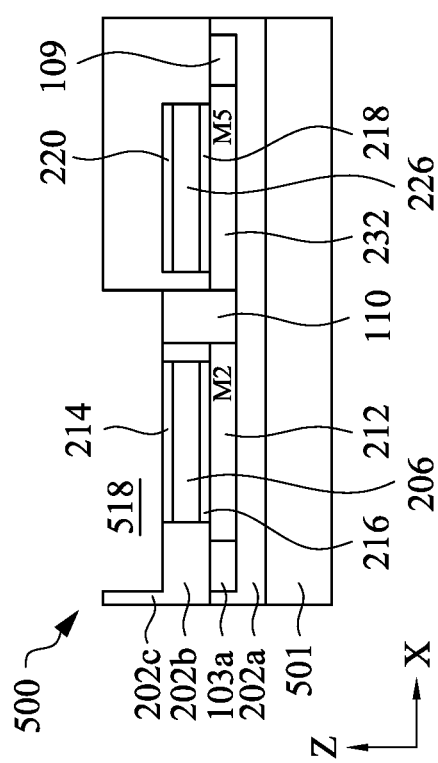

Referring to FIGS. 20 and 32, the method 400 at operation 418 forms the p-channel layer 210 in the trench 518 to engage with the gate layer 206 and the gate dielectric layer 214. In some embodiments, other p-channel layers disposed at the same level as the p-channel layer 210, such as the p-channel layer 240, are also formed at operation 418.

The p-channel layer 210 includes a doped or undoped semiconductor material, such as nickel oxide (NiO), copper oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), tin oxide (SnO), the like, or combinations thereof. The p-channel layer 210 may be formed by any suitable deposition process, such as CVD, ALD, PVD, the like, or combinations thereof. In the present embodiments, the p-channel layer 210 engages with the gate layer 206 and the gate dielectric layer 214 to form the transistor M1. In other words, the transistors M1 and M2 share the gate layer 206 and are arranged in a stacked configuration along the Z axis.

Referring to FIGS. 20 and 33-38, the method at operation 420 forms additional conductive features, such as the first contact 101a and top and lateral portions of the interconnect structure 110, for example, coupled to the p-channel layer 210. In some embodiments, other conductive features disposed at the same level as the first contact 101a and the portions of the interconnect structure 110, such as the first contact 101b and lateral portions of the interconnect structure 114, are also formed at operation 420.

Figure 33:
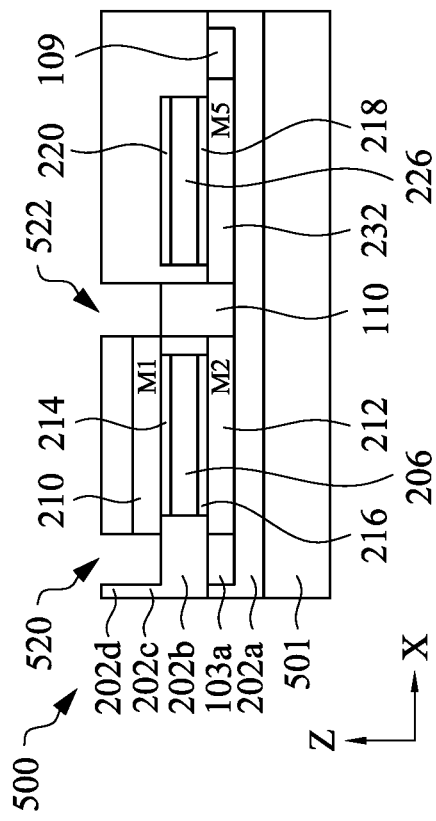
Figure 35:
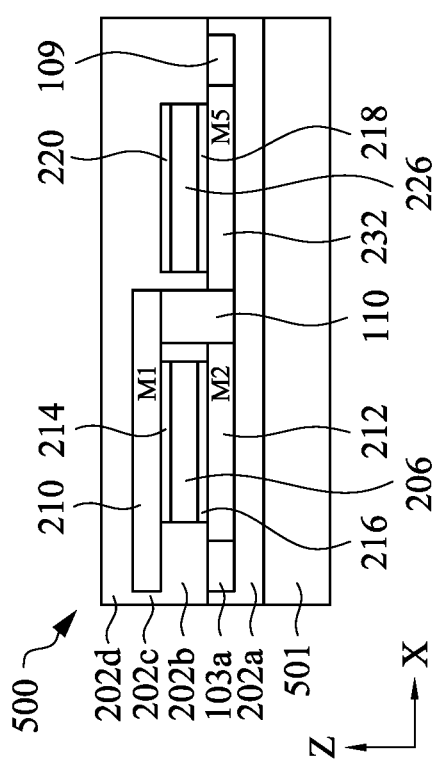
Figure 34:
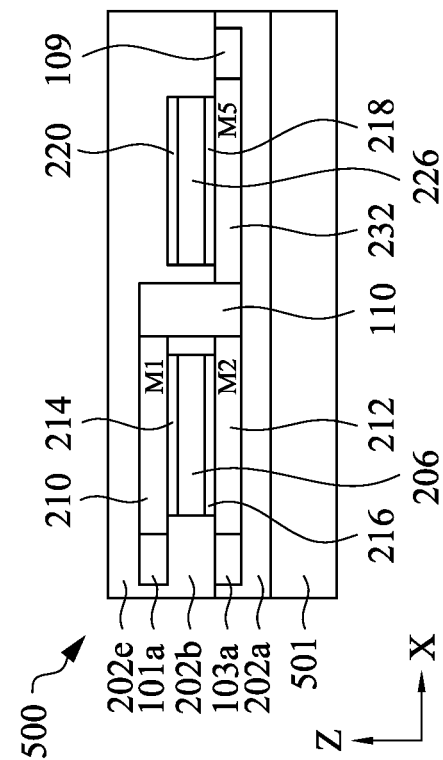

For example, referring to FIGS. 33-35, portions of the p-channel layer 210 are replaced with a conductive material to form the first contact 101a and the top portion of the interconnect structure 110. Referring to FIG. 33, a dielectric layer having a composition similar to that of the first patterned dielectric layer 202a is first formed over the p-channel layer 210 and subsequently patterned, as shown in FIG. 34, to form trenches 520 and 522 in a fourth patterned dielectric layer 202d. In some embodiments, portions of the p-channel layer 210 exposed in the trenches 520 and 522 are removed such that the trench 520 exposes the underlying second patterned dielectric layer 202b and the trench 522 exposes the underlying interconnect structure 110. Thereafter, referring to FIG. 35, the conductive material is deposited in the trenches 520 and 522 to form the first contact 101a and the top portion of the interconnect structure 110, respectively. The conductive material may include any suitable material, such as one or more of those described above with respect to forming the first contact 101a and the BBL 109.

Figure 36:
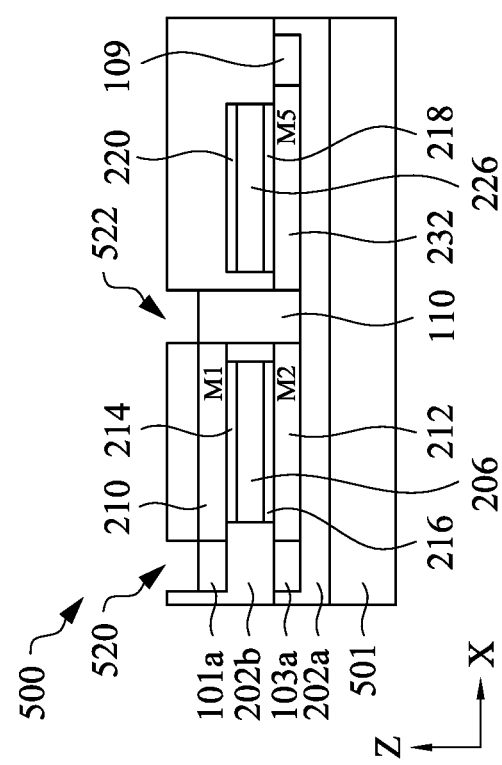

Referring to FIGS. 36 and 37, a fifth patterned dielectric layer 202e is formed over the first contact 101a, the fifth patterned dielectric layer 202e including a trench 524 that laterally extends from the interconnect structure 110 along the X axis. The fifth patterned dielectric layer 202e may include a dielectric material similar to that of the first patterned dielectric layer 202a and may be formed and patterned in a manner similar to that of forming the first patterned dielectric layer 202a. Referring to FIG. 38, a conductive material having a composition consistent with that of the interconnect structure 110 is deposited in the trench 524 to laterally extend the interconnect structure 110. The conductive material may be deposited by any suitable deposition process, such as CVD, ALD, PVD, the like, or combinations thereof. In the present embodiments, the lateral portions of the interconnect structure 110 extend in both the X axis and the Y axis (see FIGS. 4, 9, and 11) to couple the transistors M1, M2, and M5 to a common gate (e.g., the gate layer 246) of the transistors M3 and M4.

In some embodiments, though not depicted, the WL 105a and the WL 105b are formed in the fifth patterned dielectric layer 202e such that the WL 105a is coupled to the gate layer 226 and the WL 105b is coupled to the gate layer 266. The WL 105a/105b may each include a suitable conductive material similar to that of the second contact 103a and the interconnect structure 110, for example.

Referring to FIGS. 20 and 39, the method 400 at operation 422 performs additional operations to complete formation of the memory cell 500. For example, a dielectric layer (not depicted) may be deposited over the lateral portions of the interconnect structure 110 to fill the trench 524 and subsequently planarized by a CMP process. Accordingly, the various transistors of the memory cell 500 are encapsulated by the dielectric layer 202, which refers to a collection of the multiple dielectric layers (some of which are not depicted in FIG. 39), such as the first patterned dielectric layer 202a, the second patterned dielectric layer 202b, and the fifth patterned dielectric layer 202e. In some embodiments, additional interconnect structures may be formed to couple components of the memory cell 500 with an adjacent memory cell or with portions of a peripheral circuits.

One aspect of this description relates to an SRAM cell. The SRAM cell includes a first n-type channel (n-channel) layer engaged with a first gate layer to form a first device. The SRAM cell includes a first p-type channel (p-channel) layer engaged with the first gate layer to form a second device, the first gate layer stacked between the first n-channel layer and the first p-channel layer along a first direction. The SRAM cell includes a second n-channel layer engaged with a second gate layer to form a third device, the second gate layer coupled to a first word line and the second n-channel layer coupled to the first n-channel layer along a second direction perpendicular to the first direction. The SRAM cell includes a third n-channel layer engaged with a third gate layer to form a fourth device, the third n-channel layer spaced from the second n-channel layer along a third direction perpendicular to the first direction and the second direction. The SRAM cell includes a second p-channel layer engaged with the third gate layer to form a fifth device, the third gate layer stacked between the third n-channel layer and the second p-channel layer along the first direction. The SRAM cell includes a fourth n-channel layer engaged with a fourth gate layer to form a sixth device, the fourth gate layer coupled to a second word line and the fourth n-channel layer coupled to the third n-channel layer along the second direction.

Another aspect of this description relates to an SRAM cell. The SRAM cell includes a first n-type metal-oxide-semiconductor (NMOS) device including a first channel layer engaged with a first gate layer. The SRAM cell includes a first p-type metal-oxide-semiconductor (PMOS) device including a second channel layer engaged with the first gate layer, wherein the first gate layer is interposed between the first channel layer and the second channel layer along a first direction, and wherein the first NMOS device and the first PMOS device form a first inverter. The SRAM cell includes a second NMOS device adjacent the first NMOS device along a second direction perpendicular to the first direction and including a third channel layer engaged with a second gate layer. The SRAM cell includes a third NMOS device including a fourth channel layer engaged with a third gate layer, the fourth channel layer spaced from the third channel layer along a third direction perpendicular to the first direction and the second direction. The SRAM cell includes a second PMOS device including a fifth channel layer engaged with the third gate layer, wherein the third gate layer is interposed between the fourth channel layer and the fifth channel layer along the first direction, and wherein the third NMOS device and the second PMOS device form a second inverter. The SRAM cell includes a fourth NMOS device adjacent the third NMOS device along the second direction and including a sixth channel layer engaged with a fourth gate layer.

Another aspect of this description relates to a method of forming a memory cell. The method includes providing a semiconductor substrate including a plurality of devices. The method includes forming a first dielectric layer over the semiconductor substrate. The method includes forming a first channel layer in the first dielectric layer. The method includes forming a first contact and a vertical portion of an interconnect structure adjacent the first channel layer such that the first channel layer is interposed between the first contact and the vertical portion of the interconnect structure along a first direction. The method includes forming a gate layer over the first channel layer. The method includes forming a second channel layer over the gate layer such that the gate layer is interposed between the first channel layer and the second channel layer along a second direction perpendicular to the first direction, the first channel layer and the second channel layer having different conductivity types. The method includes extending the vertical portion of the interconnect structure along the second direction. The method includes forming a third contact adjacent the second channel layer such that the second channel layer is interposed between the third contact and the extended vertical portion of the interconnect structure along the first direction. The method includes forming a lateral portion of the interconnect structure extending away from the second channel layer along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random-access memory (SRAM) cell, comprising:
    a first n-type channel (n-channel) layer engaged with a first gate layer to form a first device;
    a first p-type channel (p-channel) layer engaged with the first gate layer to form a second device, the first gate layer stacked between the first n-channel layer and the first p-channel layer along a first direction;
    a second n-channel layer engaged with a second gate layer to form a third device, the second gate layer coupled to a first word line and the second n-channel layer coupled to the first n-channel layer along a second direction perpendicular to the first direction;
    a third n-channel layer engaged with a third gate layer to form a fourth device, the third n-channel layer spaced from the second n-channel layer along a third direction perpendicular to the first direction and the second direction;
    a second p-channel layer engaged with the third gate layer to form a fifth device, the third gate layer stacked between the third n-channel layer and the second p-channel layer along the first direction; and
    a fourth n-channel layer engaged with a fourth gate layer to form a sixth device, the fourth gate layer coupled to a second word line and the fourth n-channel layer coupled to the third n-channel layer along the second direction.

2. The SRAM cell of claim 1, wherein each of the first, second, third, and fourth n-channel layers includes at least one material selected from the group consisting of indium gallium zinc oxide (IGZO), zinc oxide (ZnO), indium oxide ($In_2O_3$), tin oxide ($SnO_2$), indium gallium arsenide (InGaAs), carbon nanotube (CNT), transition metal dichalcogenides (TMD), and black phosphorus nanoribbon (BPNR).

3. The SRAM cell of claim 1, wherein each of the first and second p-channel layers includes at least one material selected from the group consisting of nickel oxide (NiO), copper oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), tin oxide (SnO), and combinations thereof.

4. The SRAM cell of claim 1, wherein the first device and the second device form a first cross-coupled inverter, and wherein the fourth device and the fifth device form a second cross-coupled inverter.

5. The SRAM cell of claim 1, further comprising a gate dielectric layer between each of the first, second, third, and fourth n-channel layers and each of the first, second, third, and fourth gate layers, respectively, and between each of the first and second p-channel layers and each of the first and the second gate layers, respectively.

6. The SRAM cell of claim 1, wherein the first n-channel layer is coupled to the second n-channel layer by a first interconnect structure along the second direction and the third n-channel layer is coupled to the fourth n-channel layer by a second interconnect structure along the second direction.

7. The SRAM cell of claim 6, wherein the first interconnect structure extends along the third direction to be further coupled to the third gate layer and the second interconnect structure extends along the third direction to be further coupled to the first gate layer.

8. The SRAM cell of claim 6, further comprising a fifth n-channel layer engaged with a fifth gate layer to form a seventh device and a sixth n-channel layer engaged with a sixth gate layer to form an eighth device adjacent the seventh device along the second direction, the sixth gate layer coupled to a read word line, wherein the second interconnect structure extends along the third direction to be further coupled to the fifth gate layer.

9. The SRAM cell of claim 1, wherein the first p-channel layer is leveled with the second p-channel layer along the first direction.

10. The SRAM cell of claim 1, wherein the first p-channel layer is leveled with the third n-channel layer along the first direction.

11. A static random-access memory (SRAM) cell, comprising:
    a first n-type metal-oxide-semiconductor (NMOS) device including a first channel layer engaged with a first gate layer;
    a first p-type metal-oxide-semiconductor (PMOS) device including a second channel layer engaged with the first gate layer, wherein the first gate layer is interposed between the first channel layer and the second channel layer along a first direction, and wherein the first NMOS device and the first PMOS device form a first inverter;
    a second NMOS device adjacent the first NMOS device along a second direction perpendicular to the first direction and including a third channel layer engaged with a second gate layer;
    a third NMOS device including a fourth channel layer engaged with a third gate layer, the fourth channel layer spaced from the third channel layer along a third direction perpendicular to the first direction and the second direction;
    a second PMOS device including a fifth channel layer engaged with the third gate layer, wherein the third gate layer is interposed between the fourth channel layer and the fifth channel layer along the first direction, and wherein the third NMOS device and the second PMOS device form a second inverter; and
    a fourth NMOS device adjacent the third NMOS device along the second direction and including a sixth channel layer engaged with a fourth gate layer.

12. The SRAM cell of claim 11, wherein:
    the second gate layer is coupled to a first word line;
    the fourth gate layer is coupled to a second word line;
    a source/drain of the first PMOS device and a source/drain of the second PMOS device are each coupled to a reference voltage; and
    a source/drain of the first NMOS device and a source/drain of the third NMOS device are each coupled to ground.

13. The SRAM cell of claim 11, wherein each of the first, third, fourth, and sixth channel layers includes at least one material selected from the group consisting of indium gallium zinc oxide (IGZO), zinc oxide (ZnO), indium oxide ($In_2O_3$), tin oxide ($SnO_2$), indium gallium arsenide (InGaAs), carbon nanotube (CNT), transition metal dichalcogenides (TMD), black phosphorus nanoribbon (BPNR), and combinations thereof.

14. The SRAM cell of claim 11, wherein each of the second and fifth channel layers includes at least one material selected from the group consisting of nickel oxide (NiO), copper oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), tin oxide (SnO), and combinations thereof.

15. The SRAM cell of claim 11, wherein the second channel layer is leveled with a top the fifth channel layer along the first direction.

16. The SRAM cell of claim 11, wherein the second channel layer is leveled with the fourth channel layer along the first direction.

17. The SRAM cell of claim 11, further comprising:
a first interconnect structure configured to couple the first NMOS device, the first PMOS device, and the second NMOS device to the third gate layer; and
a second interconnect structure configured to couple the third NMOS device, the second PMOS device, and the fourth NMOS device to the first gate layer.

18. A method of forming a memory cell, comprising:
providing a semiconductor substrate including a plurality of devices;
forming a first dielectric layer over the semiconductor substrate;
forming a first channel layer and a second channel layer in the first dielectric layer, the first channel layer and the second channel layer having the same conductivity type;
forming a first contact adjacent the first channel layer and a vertical portion of an interconnect structure interposed between the first channel layer and the second channel layer along a first direction;
forming a gate layer over the first channel layer;
forming a third channel layer over the gate layer such that the gate layer is interposed between the first channel layer and the third channel layer along a second direction perpendicular to the first direction, the first channel layer and the third channel layer having different conductivity types;
extending the vertical portion of the interconnect structure along the second direction;
forming a third contact adjacent the third channel layer such that the second third channel layer is interposed between the third contact and the extended vertical portion of the interconnect structure along the first direction; and
forming a lateral portion of the interconnect structure extending away from the third channel layer along the first direction.

19. The method of claim 18, further comprising forming a first gate dielectric layer between the first channel layer and the gate layer and forming a second gate dielectric layer between the third channel layer and the gate layer.

20. The method of claim 18, wherein the first channel layer engages with the gate layer to form a pull-down transistor and the third channel layer engages with the gate layer to form a pull-up transistor, the pull-down transistor and the pull-up transistor coupled to form an inverter of a static random-access memory (SRAM) cell.

* * * * *